United States Patent
Seo et al.

(10) Patent No.: US 8,574,709 B2
(45) Date of Patent: Nov. 5, 2013

(54) DEPOSITION DONOR SUBSTRATE AND METHOD FOR MANUFACTURING LIGHT-EMITTING DEVICE

(75) Inventors: Satoshi Seo, Kanagawa (JP); Kohei Yokoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 839 days.

(21) Appl. No.: 12/503,220

(22) Filed: Jul. 15, 2009

(65) Prior Publication Data

US 2010/0015424 A1    Jan. 21, 2010

(30) Foreign Application Priority Data

Jul. 21, 2008 (JP) ................. 2008-188004

(51) Int. Cl.
*B32B 7/02* (2006.01)
(52) U.S. Cl.
USPC ............................ 428/216; 428/213; 503/227
(58) Field of Classification Search
USPC .................................. 428/216, 213
See application file for complete search history.

(56) References Cited

U.S. PATENT DOCUMENTS

| | | | |
|---|---|---|---|
| 4,772,582 A | 9/1988 | DeBoer | |
| 5,742,129 A | 4/1998 | Nagayama et al. | |
| 5,851,709 A | 12/1998 | Grande et al. | |
| 5,937,272 A | 8/1999 | Tang | |
| 6,165,543 A | 12/2000 | Otsuki et al. | |
| 7,956,008 B2 | 6/2011 | Higo et al. | |
| 2005/0266186 A1* | 12/2005 | Nguyen et al. | 428/32.77 |
| 2006/0246240 A1 | 11/2006 | Matsuda et al. | |
| 2008/0299496 A1 | 12/2008 | Hirakata et al. | |
| 2009/0325451 A1* | 12/2009 | Higo et al. | 445/24 |
| 2011/0206868 A1 | 8/2011 | Higo et al. | |
| 2011/0298002 A1* | 12/2011 | Takeuchi et al. | 257/99 |
| 2012/0008227 A1* | 1/2012 | McCaslin et al. | 360/46 |

FOREIGN PATENT DOCUMENTS

| | | |
|---|---|---|
| EP | 0 851 714 A2 | 7/1998 |
| EP | 1 176 642 A2 | 1/2002 |
| JP | 10-208881 | 8/1998 |
| JP | 2000-77182 | 3/2000 |
| JP | 2002-110350 | 4/2002 |
| JP | 2006-309995 | 11/2006 |
| JP | 2010-34022 | 2/2010 |
| JP | 2010-199095 | 9/2010 |

* cited by examiner

*Primary Examiner* — Maria Veronica Ewald
*Assistant Examiner* — Laura Auer
(74) *Attorney, Agent, or Firm* — Husch Blackwell LLP

(57) ABSTRACT

One surface of a first substrate provided with at least light-absorbing layers separately formed, partition layers each formed between the light-absorbing layers and having an inverse taper shape, and material layers formed on the light-absorbing layers and on the partition layers so that the material layers are separated from each other is disposed to face a deposition target surface of a second substrate; light irradiation is performed from the other surface of the first substrate, only the material layers in regions overlapped with the light-absorbing layers are heated and evaporated to the deposition target surface of the second substrate.

33 Claims, 12 Drawing Sheets

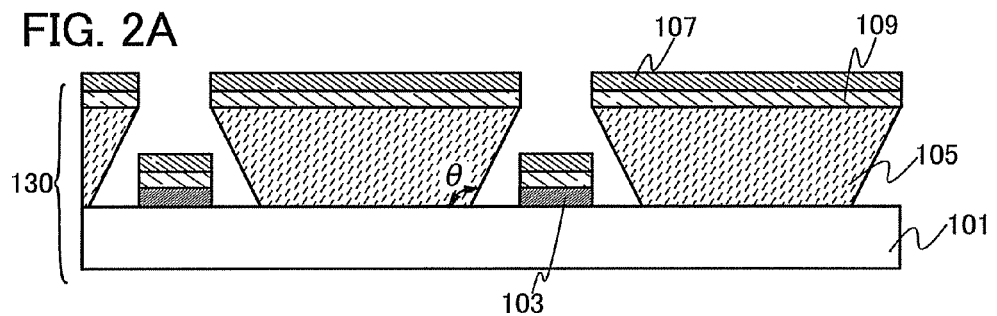
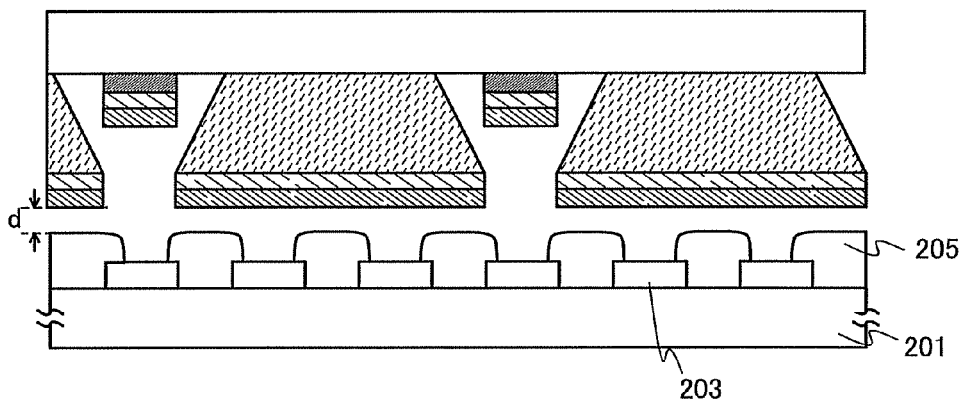
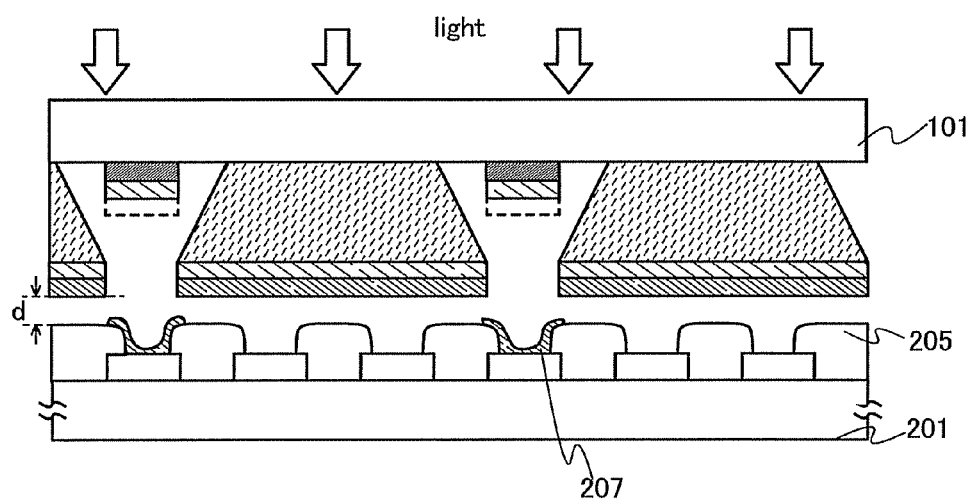

DEPOSITION DONOR SUBSTRATE AND METHOD FOR MANUFACTURING LIGHT-EMITTING DEVICE

BACKGROUND OF THE INVENTION

1. Field of the Invention

The present invention relates to a deposition donor substrate used for deposition of a material that can be deposited by an evaporation method and a method for manufacturing a light-emitting device using the deposition donor substrate.

2. Description of the Related Art

Light-emitting elements, which use organic compounds as a light emitter and are characterized by the thinness, lightweight, fast response, and direct current low voltage driving, are expected to be applied to next-generation flat panel displays. In particular, display devices having light-emitting elements arranged in matrix are thought to be superior to conventional liquid crystal display devices for their wide viewing angles and excellent visibility.

As for a light-emitting mechanism of a light-emitting element, an EL layer is interposed between a pair of electrodes and voltage is applied, whereby electrons injected from a cathode and holes injected from an anode recombine in an emission center of the EL layer to form molecular excitons, and the molecular excitons release energy when relaxing into a ground state; therefore, light is emitted. A singlet excited state and a triplet excited state are known as excited states, and it is thought that light emission can be obtained through either of the excited states.

An EL layer included in a light-emitting element includes at least a light-emitting layer. In addition, the EL layer can have a stack structure including a hole-inject layer, a hole-transport layer, an electron-transport layer, an electron-inject layer, and the like, in addition to the light-emitting layer.

In addition, EL materials for forming EL layers are broadly classified into low molecular (monomer) materials and high molecular (polymer) materials. In general, a film of a low molecular material is often formed by an evaporation method, and a film of a high molecular material is often formed by an inkjet method or the like.

An evaporation apparatus which is used in an evaporation method has a substrate holder on which a substrate is set; a crucible (or an evaporation boat) containing an EL material, i.e., an EL layer-forming material; a heater for heating the EL material in the crucible; and a shutter for preventing the EL material from being diffused during sublimation. The EL material heated by the heater is sublimed and deposited to the substrate.

In order to form a uniform film, actually, a deposition target substrate needs to be rotated, or the substrate and the crucible need to be separated from each other by at least a certain distance. In addition, when films of different colors are separately formed using plural kinds of EL materials through a mask such as a metal mask, it is necessary that the distance between pixels be designed to be large and that the width of a partition layer (bank) formed using an insulator between pixels be large. Such needs are major problems in advancing high definition (increasing the number of pixels) and miniaturization of display pixel pitches along, in a light-emitting device including a light-emitting element. Further, there is a problem in that, with a larger deposition target substrate, a mask covering a substrate sags and accordingly an EL layer cannot be formed accurately.

Further, as for flat panel displays, it has been necessary to solve those problems as well as to improve productivity and reduce costs, in order to achieve higher definition.

Thus, a method for forming an EL layer of a light-emitting element through laser thermal transfer has been proposed (e.g., see Patent Document 1). Patent Document 1 discloses a transfer substrate which has a photothermal conversion layer including a low-reflective layer and a high-reflective layer, and a transfer layer, on a supporting substrate. Irradiation of such a transfer substrate with laser light allows the transfer layer to be transferred to an element-forming substrate.

[Patent Document 1] Japanese Published Patent Application No. 2006-309995

SUMMARY OF THE INVENTION

However, in a conventional transfer substrate having a photothermal conversion layer, heat converted from light in the photothermal conversion layer is conducted not only in the thickness direction but also in the plane direction of the photothermal conversion layer. Such heat conduction in the plane direction of the photothermal conversion layer causes a problem in that an extensive region of the transfer layer is transferred.

Thus, an object of an embodiment of the present invention is to provide a deposition donor substrate and a method for manufacturing a light-emitting device which can advance miniaturization of each display pixel pitch with an increase in definition (an increase in the number of pixels) and a reduction in the size of a light-emitting device. Further, an object of an embodiment of the present invention is to provide a method for manufacturing a light-emitting device in which an EL layer is formed accurately.

Furthermore, an object of an embodiment of the present invention is to facilitate manufacture of a deposition donor substrate to reduce manufacturing costs.

An embodiment of the present invention is a deposition donor substrate including light-absorbing layers separated from each other on a substrate, partition layers each formed between the light-absorbing layers, and material layers formed on the light-absorbing layers and on the partition layers so that the material layers are separated from each other. The partition layer has an inverse taper shape and has a thickness larger than the sum of the thickness of each light-absorbing layer and thickness of each material layer.

Further, an embodiment of the present invention is a deposition donor substrate including light-absorbing layers separated from each other on a substrate, partition layers each formed between the light-absorbing layers, reflective layers formed on the light-absorbing layers and on the partition layers so that the reflective layers are separated from each other, and material layers separated from each other on the reflective layers. The partition layer has an inverse taper shape and has a thickness larger than the sum of the thickness of each light-absorbing layer and thickness of each material layer.

Note that in any of the above structures, in each partition layer, the angle between the side in contact with the substrate and a sidewall is greater than or equal to 100° and less than or equal to 130°.

Further, in any of the above structures, the thickness of the light-absorbing layer is greater than or equal to 100 nm and less than or equal to 500 nm and the thickness of the partition layer is greater than or equal to 1 μm and less than or equal to 2 μm.

An embodiment of the present invention is a method for manufacturing a light-emitting device by using of the above deposition donor substrates. The method includes the steps of disposing one surface of a first substrate, which is provided with at least light-absorbing layers separated from each other, partition layers each formed between the light-absorbing layers and having an inverse taper shape, and material layers formed on the light-absorbing layers and on the partition layers so that the material layers are separated from each other, to face a deposition target surface of a second substrate, performing light irradiation from the other surface of the first substrate, heating the material layers in regions overlapped with the light-absorbing layers, and evaporating the material layers in regions overlapped with the light-absorbing layers to the deposition target surface of the second substrate.

Further, an embodiment of the present invention is a method for manufacturing a light-emitting device by using of the above deposition donor substrates. The method includes the steps of disposing one surface of a first substrate, which is provided with at least light-absorbing layers separated from each other, partition layers each formed between the light-absorbing layers and having an inverse taper shape, reflective layers formed on the light-absorbing layers and on the partition layers so that the reflective layers are separated from each other, and material layers separated from each other on the light-absorbing layers and on the partition layers with the reflective layers interposed therebetween, to face a deposition target surface of a second substrate, performing light irradiation from the other surface of the first substrate, heating the material layers in regions overlapped with the light-absorbing layers, and evaporating the material layers in regions overlapped with the light-absorbing layers to the deposition target surface of the second substrate.

Further, an embodiment of the present invention also includes not only a light-emitting device having a light-emitting element but also an electronic device having the light-emitting device. Accordingly, the term light-emitting device in the present specification includes an image display device, a light-emitting device, or a light source (including a lighting apparatus). Further, the following are all included in the "light-emitting device": a module in which a connector, for example, a flexible printed circuit (FPC), a tape automated bonding (TAB) tape, or a tape carrier package (TCP) is attached to a panel provided with a light-emitting element; a module provided with a printed wiring board at the end of the TAB tape or the TCP; and a module in which an integrated circuit (IC) is directly mounted to a light-emitting element by chip on glass (COG) method.

According to a deposition donor substrate of an embodiment of the present invention, since the partition layer has an inverse taper shape and thus there is a space between the partition layer and the light-absorbing layer, heat conduction from the light-absorbing layers to the partition layers can be suppressed, so that the material layers that are formed on the partition layers can be prevented from being heated. This makes it possible to sublime only the material layers in regions overlapped with the light-absorbing layers so that an EL layer having a desired pattern can be formed over the second substrate.

Further, according to a deposition donor substrate of an embodiment of the present invention, because of the difference in thickness between the light-absorbing layer and the partition layer and further because of the inverse taper shape of the partition layer, the material layers or the reflective layers can be formed so that they are separated from each other. Therefore, the material layers or the reflective layers can be formed to have a desired pattern. Accordingly, it is not necessary to perform a photolithography process that is generally required to form a pattern over a deposition donor substrate, which results in a reduction in manufacturing costs of the deposition donor substrate.

In addition, by using a deposition donor substrate of an embodiment of the present invention, the thickness of a film formed over a deposition target substrate can be controlled by controlling the thicknesses of the material layers formed in the deposition donor substrate. Therefore, a practitioner does not need to adjust the evaporation rate by using a thickness monitor, and thus the deposition process can be fully automated.

Furthermore, by using a deposition donor substrate of an embodiment of the present invention, an EL layer-forming material included in the material layers formed in the deposition donor substrate can be uniformly sublimed during deposition. Moreover, even when the material layers include plural kinds of EL layer-forming materials, a film containing the same EL layer-forming materials at roughly the same weight ratio as the material layers can be formed over the deposition target substrate. Accordingly, in the case where plural kinds of EL layer-forming materials having different evaporation temperatures are used for deposition, the deposition using a deposition donor substrate of an embodiment of the present invention does not need control of the evaporation rate of each EL layer-forming material, unlike the case of co-evaporation. Thus, without complicated control of the evaporation rate or the like, a desired layer containing different EL layer-forming materials can be formed easily and accurately.

Thus, according to a method for manufacturing a light-emitting device with the use of any of the aforementioned deposition donor substrates, a flat and even film can be formed and a fine pattern can also be formed. Accordingly, a light-emitting device with high definition can be obtained, and further the characteristics of the light-emitting device can be improved.

Furthermore, according to a method for manufacturing a light-emitting device with the use of any of the aforementioned deposition donor substrates, use efficiency of the EL layer-forming material can be improved. In addition, a deposition donor substrate of an embodiment of the present invention can be reused by being washed after completion of the formation of the EL layer. Furthermore, by using, for example, a lamp heater with high energy as the light source for deposition, a film can be formed on a large area at a time, which results in a reduction in manufacturing costs of the light-emitting device.

BRIEF DESCRIPTION OF THE DRAWINGS

FIGS. 2A to 2C illustrate a deposition donor substrate and a deposition method.

DETAILED DESCRIPTION OF THE INVENTION

Hereinafter, embodiments of the present invention will be described in detail with reference to the accompanying drawings. However, the present invention is not limited to explanation to be given below, and it is to be easily understood that modes and details thereof can be variously modified without departing from the purpose and the scope of the present invention. Therefore, the embodiments of the present invention should not be construed as being limited to the description of the embodiment below.

(Embodiment 1)

A deposition donor substrate and a method for manufacturing a light-emitting device according to Embodiment 1 will be described using FIGS. 1A to 1C.

Figure 1A:
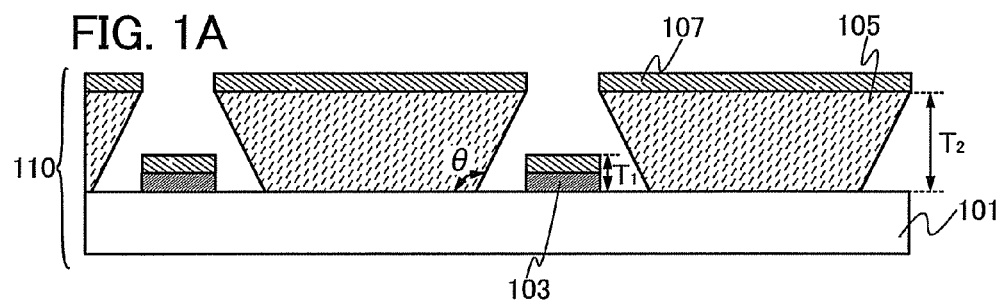
FIGS. 1A to 1C illustrate a deposition donor substrate and a deposition method.

FIG. 1A illustrates an example of a deposition donor substrate 110 according to Embodiment 1. In FIG. 1A, on a first substrate 101 which is a supporting substrate, a plurality of light-absorbing layers 103 which are island shaped or stripe shaped are provided so that they are separated from each other. Further, partition layers 105 are each formed between the light-absorbing layers 103. Furthermore, material layers 107 are formed on the light-absorbing layers 103 and on the partition layers 105 so that the material layers 107 are separated from each other.

A method for manufacturing a deposition donor substrate according to Embodiment 1 which is illustrated in FIG. 1A and a method for manufacturing a light-emitting device by using the deposition donor substrate will be described.

First, the light-absorbing layers are formed on the first substrate 101, and then patterned so that they are island shaped or stripe shaped. The first substrate 101 is the supporting substrate for the light-absorbing layers, the material layers, the partition layers, and the like, and transmits irradiation light for evaporation of the material layer to a deposition target substrate in a manufacturing process of a light-emitting device. Therefore, the first substrate 101 preferably has high light transmittance. Specifically, when lamp light or laser light is used for evaporation of the material layer, a substrate that transmits the light is preferably used as the first substrate 101. As the first substrate 101, for example, a glass substrate, a quartz substrate, or the like can be used. To a glass substrate, a quartz substrate, or the like, an impurity (such as moisture) is less likely to be adsorbed or attached than to a film substrate or the like. Thus, incorporation of impurities can be prevented during deposition.

The light-absorbing layers 103 absorb irradiation light for heating the material layer 107 and convert the light to heat in the manufacturing process of a light-emitting device. It is preferable that the light-absorbing layers 103 be formed using a material having a reflectance less than or equal to 70% for irradiation light and having high absorptance. It is also preferable that the light-absorbing layers 103 be formed using a material having excellent heat resistance so that it does not change with heat.

For the light-absorbing layers 103, any of a variety of materials can be used. For example, a metal nitride such as titanium nitride, tantalum nitride, molybdenum nitride, tungsten nitride, or chromium nitride; a metal such as titanium, molybdenum, or tungsten; carbon; or the like can be used. Note that, since what kind of material is preferably used for the light-absorbing layers 103 varies depending on the wavelength of irradiation light, the material needs to be selected as appropriate. For example, for light having a wavelength of 800 nm, molybdenum, tantalum nitride, titanium, tungsten, or the like is preferably used. For light having a wavelength of 1300 nm, tantalum nitride, titanium, or the like is preferably used. Further, each light-absorbing layer 103 is not limited to a single layer and may include plural layers. For example, a stack structure of a metal and a metal nitride may be employed.

Note that the light-absorbing layers 103 can be formed by any of a variety of methods. For example, the light-absorbing layers 103 can be formed by a sputtering method using a target of molybdenum, tantalum, titanium, tungsten, an alloy thereof, or the like. In addition, each light-absorbing layer 103 is not limited to a single layer and may include plural layers.

Preferably, each light-absorbing layer 103 has a thickness such that it does not transmit irradiation light. The thickness is preferably greater than or equal to 100 nm and less than or equal to 500 nm although it depends on the material. By setting the thickness of the light-absorbing layer 103 to greater than or equal to 100 nm and less than or equal to 500 nm, irradiation light is efficiently absorbed, so that heat can be generated.

Since the light-absorbing layers 103 absorb irradiation light and convert the light to heat the material layers 107 that are located in regions overlapped with the light-absorbing layers, it is preferable that each light-absorbing layer 103 be provided so as to have approximately the same size as a pixel which is to be formed over the deposition target substrate or as the width of this pixel. Note that in the case of manufacturing a deposition target substrate for full-color display, one light-absorbing layer 103 is preferably provided for every three pixels (R, G, and B) of plural pixels which are to be formed over the deposition target substrate. With the use of three such deposition donor substrates, the material layers of the deposition donor substrates can be transferred to all of the plural pixel regions of the deposition target substrate.

Note that although a variety of methods can be used to form the pattern of the light-absorbing layers 103, dry etching is preferably used. By use of dry etching, the light-absorbing layers 103 patterned have a sharper sidewall, whereby a fine pattern can be formed.

Note that irradiation light may be partly transmitted through the light-absorbing layers 103 as long as an EL layer-forming material included in the material layers 107 can be heated to the temperature at which the EL layer-forming material is transferred to the deposition target substrate. Note that when irradiation light may be partly transmitted, a material that does not decompose even when irradiated with light is preferably used for the material layers 107.

After the light-absorbing layers 103 are formed, the partition layers 105 are each formed between the light-absorbing layers 103. The partition layers 105 are provided in order to prevent the material layers 107 that are not overlapped with the light-absorbing layers 103 from being heated in the manufacturing process of a light-emitting device, so that an enlargement of the EL layer formed on the deposition donor substrate can be suppressed. As a material for the partition layers 105, a photocurable resin or a thermosetting resin can be used. Examples of photocurable resins and thermosetting resins that can be used include acrylic resins, novolac resins, resins including silicon, diallyl phthalate resins, vinyl chloride resins, vinyl acetate resins, polyvinyl alcohols, polystyrenes, methacrylic resins, polyethylene resins, polypropylenes, polycarbonates, polyesters, polyamides (nylons), polyimides, phenolic resins, melamine resins, epoxy resins, and the like. Alternatively, instead of a photocurable resin or a thermosetting resin, an inorganic material can be used. Note that for the partition layers 105, a material having lower thermal conductivity than that of the material used for the light-absorbing layers 103 is preferably used.

The partition layers 105 can be formed as follows: a layer including the material for the partition layers is formed on the entire surface of the first substrate 101; then, in accordance with a photolithography method, a positive-type photosensitive resin of which a portion unexposed to light remains is used, and the amount of light exposure or the length of development time is adjusted so that a lower portion of a pattern is etched more.

A cross section of each partition layer 105 is a so-called inverse taper shape in which the side in contact with the first substrate 101 is short and the opposite side is long. A taper angle θ (angle between the side in contact with the first substrate 101 and the sidewall) of the partition layer 105 is preferably greater than or equal to 100° and less than or equal to 130°. The larger the taper angle is, the easier it is to form the material layers 107 which are formed later so that they are separated from each other; however, the strength of the partition layer 105 is then reduced. The inverse taper shape of the partition layer 105 kept the partition layer 105 and the light-absorbing layer 103 from being in contact with each other. Therefore, heat conduction from the light-absorbing layer 103 to the partition layer 105 can be suppressed, so that the material layers 107 that are located on the partition layers 105 can be prevented from being heated.

Further, each partition layer 105 is formed to a thickness greater than or equal to 1 μm and less than or equal to 2 μm. The partition layer 105 having a thickness greater than or equal to 1 μm can make difference in thickness between the partition layer 105 and the light-absorbing layer 103; accordingly, the material layers formed later can be formed so that they are separated from each other. Furthermore, with the partition layer 105 having a thickness greater than or equal to 1 μm, light transmission or heat conduction in the partition layer 105, which may heat the material layers 107 that are overlapped with the partition layers 105, can be suppressed. Moreover, with the partition layer 105 having a thickness greater than or equal to 2 Jim, the EL layer-forming material can be prevented from being attached to the sidewall of the partition layer 105 when the material layers 107 that are formed in the regions overlapped with the light-absorbing layers 103 are heated. Thus, use efficiency of the EL layer-forming material can be improved. In addition, the accuracy in formation of the pattern of the EL layer formed over the deposition target substrate can be improved.

Next, on the partition layers 105 and the light-absorbing layers 103, the material layers 107 including the EL layer-forming material are formed. The material layers 107 are transferred to a second substrate by being heated. As the EL layer-forming material, there are a variety of materials. In addition, the material layers 107 may include plural kinds of EL layer-forming materials. Further, each material layer 107 may be a single layer or a stack of plural layers. It is possible to perform co-evaporation of a stack of plural layers including EL layer-forming materials. Note that plural layers including EL layer-forming materials are preferably stacked so that an EL layer-forming material that has a lower decomposition temperature is included in a layer nearer the first substrate. Alternatively, plural layers are preferably stacked so that an EL layer-forming material which has a lower evaporation temperature is included in a layer nearer first substrate. Such a structure enables plural layers including EL layer-forming materials to be efficiently heated, so that the EL layer can be formed efficiently. Note that, in this specification, "evaporation temperature" means the temperature at which the material is sublimed. In addition, "decomposition temperature" means the temperature at which a change occurs by effect of heat in at least part of the chemical formula expressing the material.

The material layers 107 are formed by any of a variety of methods. For example, a dry process such as a vacuum evaporation method or a sputtering method can be used. Alternatively, a wet process such as a spin coating method, a spray coating method, an inkjet method, a dip coating method, a casting method, a die coating method, a roll coating method, a blade coating method, a bar coating method, a gravure coating method, or a printing method can be used. In order to form the material layers 107 by such a wet process, a desired EL layer-forming material may be dissolved or dispersed in a solvent, and the solution or the dispersion may be adjusted. There is no particular limitation on the solvent as long as the EL layer-forming material can be dissolved or dispersed in the solvent and the solvent does not react with the material. For example, as a solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, or xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; or the like. A mixture of plural these solvents may also be used. The use of a wet process makes it possible to increase use efficiency of a material and reduce manufacturing costs of a light-emitting device.

Note that because of the difference in thickness between the light-absorbing layer 103 and the partition layer 105 and because of the inverse taper shape of the partition layer 105, the material layers 107 can be formed so that they are separated from each other. Therefore, there is no need for a photolithography process for forming the material layers 107 so that they are separated from each other. By forming the material layers 107 so that they are separated from each other, horizontal conduction of heat in the material layers 107, which may cause an enlargement of a region that is to be transferred, can be suppressed; accordingly, the fine pattern of the EL layer can be formed. The thickness $T_2$ of the partition layer 105 is larger than the thickness $T_1$ which represents the sum of the thickness of the light-absorbing layer 103 and the thickness of each material layer 107 that are provided on the light-absorbing layers 103.

The thickness of an EL layer 207 formed over a second substrate 201 which is the deposition target substrate in a later step depends on the thicknesses of the material layers 107 formed on the first substrate which is the supporting substrate. Therefore, by controlling the thicknesses of the material layers, the thickness of the EL layer 207 formed over the second substrate 201 which is the deposition target substrate can be easily controlled. Note that uniformity of the material layers is not necessarily required as long as the thickness and uniformity of the EL layer are ensured. For example, the material layers may be fine island shaped or uneven layer shaped.

Note that as the EL layer-forming material, any of a variety of materials can be used regardless of whether it is an organic compound or an inorganic compound. In particular, many organic compounds have lower evaporation temperatures than inorganic compounds; thus, organic compounds can be easily evaporated by light irradiation and are suitable for the method for manufacturing a light-emitting device according to Embodiment 1. Examples of organic compounds include a light-emitting material, a carrier-transport material, and the like which are used for a light-emitting device. Examples of inorganic compounds include a metal oxide, a metal nitride, a metal halide, an elemental metal, and the like which are used for a carrier-transport layer, a carrier-inject layer, an electrode, and the like of a light-emitting device.

Figure 1B:
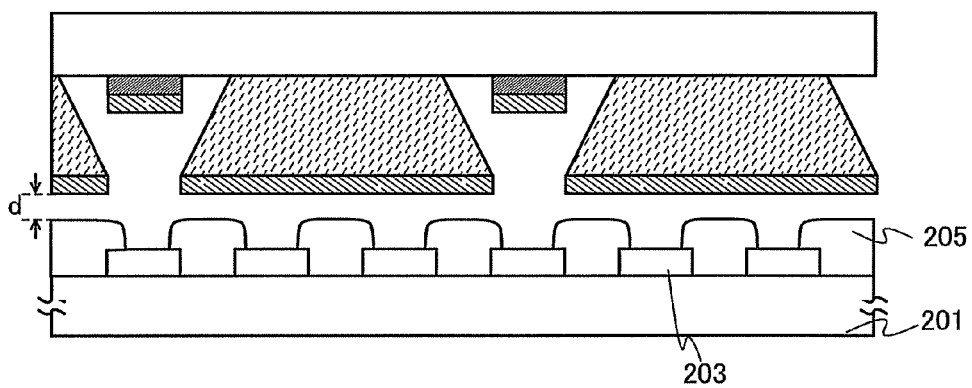

Next, as illustrated in FIG. 1B, the second substrate 201 which is the deposition target substrate is disposed to face the surface of the first substrate 101 on which the light-absorbing layer 103, the partition layer 105, and the material layer 107 are formed. The second substrate 201 is the deposition target substrate over which a desired layer is to be formed by heat treatment of light irradiation.

The first substrate 101 and the second substrate 201 are disposed in close proximity to each other; specifically, they are disposed close to each other such that the distance d between the surface of the material layer 107 provided on the first substrate 101 and the second substrate 201 is in the range from 0 mm to 2 mm, preferably from 0 mm to 0.05 mm, more preferably from 0 mm to 0.03 mm. By reducing the distance d to around the above range, the use efficiency of the EL layer-forming material can be improved. In addition, the accuracy in formation of the pattern of the EL layer 207 formed over the deposition target substrate can be improved.

Note that the distance d is defined as the distance between the surface of each of the material layers 107 that are formed on the partition layers 105 and the surface of the deposition target substrate. Further, when some layer (e.g., a conductive layer which functions as an electrode or an insulating layer which functions as a partition layer) is formed over the deposition target substrate, the distance d is defined as the distance between the surface of each of the material layers 107 that are formed on the partition layers 105 and the surface of the layer that is formed over the deposition target substrate. Note that when the surface of each of the material layers that are formed on the partition layers 105 or the surface of the layer that is formed over the deposition target substrate is uneven, the distance d is defined as the shortest distance between the surface of each of the material layers that are formed on the partition layers 105 and the outermost surface of the deposition target substrate or the layer that is formed over the deposition target substrate.

In order to improve the use efficiency of the material and to also improve the accuracy in formation of the pattern, the distance between the first substrate and the second substrate is preferably short. The thickness $T_2$ of the partition layer 105 is larger than the thickness $T_1$ which is the sum of the thickness of the light-absorbing layer 103 and the thickness of each of the material layers 107 that are provided on the light-absorbing layers 103. Thus, even when the surface of the second substrate 201 is in contact with the surfaces of the material layers that are formed on the partition layers 105, the surfaces of the material layers 107 that are formed on the light-absorbing layers 103 are not in contact with the surface of the second substrate 201. Therefore, the distance d can be 0 mm.

Figure 1C:
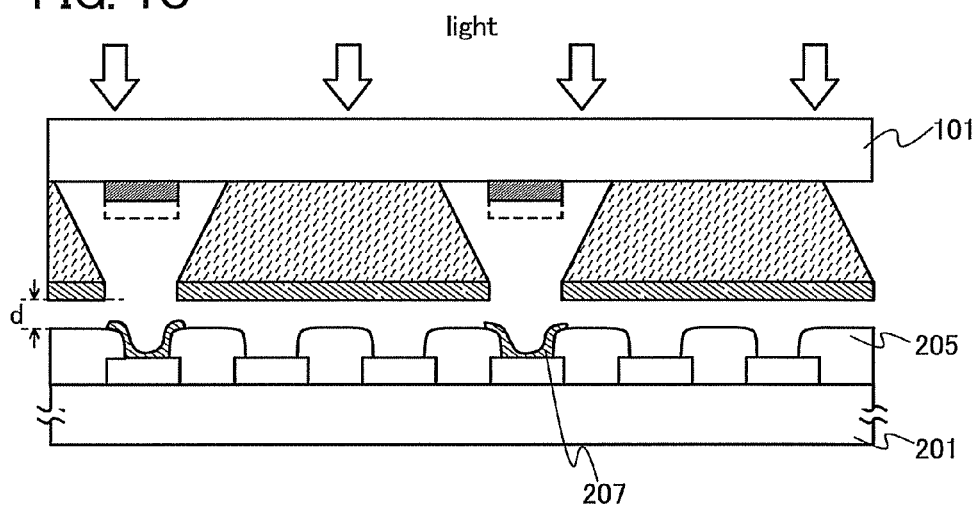

In FIGS. 1B and 1C, the second substrate 201 is provided with a first electrode layer 203. Edge portions of the first electrode layer 203 are preferably covered with an insulator 205. In Embodiment 1, the first electrode layer represents an electrode which serves as an anode or a cathode of a light-emitting element.

After the first substrate 101 and the second substrate 201 are disposed, light irradiation is performed from the rear surface of the first substrate 101, that is, from the surface opposite the surface where the material layers 107 are formed, as illustrated in FIG. 1C. Irradiation light is absorbed by the light-absorbing layers 103. Light absorbed is converted to heat energy, so that the material layers 107 that are in contact with the light-absorbing layers 103 are heated and sublimed. The EL layer-forming material sublimed is attached to the first electrode layer and deposited to form the EL layer 207.

According to the deposition donor substrate of Embodiment 1, because of the inverse taper shape of the partition layer 105, the partition layer 105 and the light-absorbing layer 103 have a space therebetween and are not in contact with each other. Since heat conduction is more difficult in gas than in solid, the existence of the space can suppress conduction of heat generated in the light-absorbing layers to the partition layers 105, so that the material layers 107 that are formed on the partition layers 105 can be prevented from being heated. Since heat conduction is further difficult under a reduced pressure, evaporation is preferably performed under a reduced pressure. The reduced-pressure atmosphere can be obtained by evacuation of the deposition chamber with a vacuum evacuation unit to a vacuum of about $5 \times 10^{-3}$ Pa or less, preferably, about $10^{-4}$ to $10^{-6}$ Pa.

Further, in some cases, the partition layer 105 is heated when the first substrate 101 is irradiated with light. However, the material layers 107 that are formed on the partition layers 105 can be prevented from being heated, since the deposition donor substrate according to Embodiment 1 has the partition layers 105 which are formed using a material having lower heat conductivity than that of the material for the light-absorbing layers 103 and have a large thickness. This makes it possible to sublime only the material layers 107 that are overlapped with the light-absorbing layers 103 so that the EL layer 207 having a desired pattern can be formed over the second substrate.

As a light source of irradiation light, any of a variety of light sources can be used.

Examples of the light sources that can be used include discharge lamps such as a xenon lamp and a metal halide lamp, and exothermic lamps such as a halogen lamp and a tungsten lamp. Alternatively, such a light source may be used as a flash lamp (e.g., a xenon flash lamp or a krypton flash lamp). Since a flash lamp is capable of repeatedly emitting very high-intensity light to a large area for a short time (0.1 to 10 msec), it can uniformly and efficiently heat the first substrate regardless of the area of the first substrate. Further, heating the first substrate 101 can be controlled by varying the time interval of light emission. In addition, since a flash lamp has long lifetime and low power consumption on standby for light emission, the running cost can be suppressed.

As the light source, laser light may be used. Examples of light sources of laser light include a gas laser such as an Ar laser, a Kr laser, or an excimer laser; a laser using, as a medium, single crystal YAC, YVO$_4$, forsterite (Mg$_2$SiO$_4$), YAlO$_3$, or GdVO$_4$, or polycrystalline (ceramic) YAC, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; and a combination thereof. The use of a solid-state laser that uses a solid as a laser medium is advantageous in that a maintenance-free condition can be maintained for a long time and output is relatively stable.

Note that irradiation light is preferably infrared light (at a wavelength of 800 nm or more). With infrared light, the light-absorbing layers 103 can efficiently convert it to heat so that the EL layer-forming material can be efficiently heated.

In the method for manufacturing a light-emitting device according to Embodiment 1, since only the material layers that are in contact with the light-absorbing layers among the material layers formed in the deposition donor substrate are heated, the length of time for light irradiation may be relatively short compared to the case where all the surfaces of the material layers are heated. For example, when a halogen lamp is used as the light source, by keeping 500 to 800° C. for about 7 to 15 seconds, the material layers that are overlapped with the light-absorbing layers can be sublimed and evaporated to the second substrate.

Note that although the case where the second substrate which is the deposition target substrate is located below the first substrate which is the supporting substrate is illustrated in Embodiment 1, Embodiment 1 is not limited to this structure. The disposition of the substrates can be determined as appropriate.

By reducing the distance d between the first substrate and the second substrate, the use efficiency of the material can be improved. In addition, the accuracy in formation of a pattern of a layer formed over the second substrate can be improved. Note that in the case where the surface of the second substrate is even, the distance d between the second substrate 201 which is the deposition target substrate and the first substrate 101 which is the supporting substrate is preferably more than 0 mm.

In addition, since the partition layer 105 with a thickness greater than or equal to 1 μm and less than or equal to 2 μm can ensure the distance between the light-absorbing layer 103 which is a heat source and the deposition target substrate, defective deposition caused when the second substrate 201 is heated due to heat from the light-absorbing layer 103 can be prevented. Furthermore, since a direction in which the material is evaporated from the material layers 107 to the deposition target substrate can be controlled, deformation of the deposition pattern over the deposition target surface can be prevented.

In the deposition method according to Embodiment 1 which is applied to a light-emitting device, by controlling the thicknesses of the material layers formed over the supporting substrate, the thickness of the EL layer formed over the deposition target substrate by an evaporation process can be controlled. In other words, the material layers formed over the supporting substrate can be directly evaporated; therefore, a thickness monitor is not needed. Accordingly, a practitioner does not have to adjust the deposition speed by use of the film-thickness monitor, and the deposition process can be fully automated.

In addition, by the deposition method according to Embodiment 1 which is applied to a light-emitting device, when the material layer includes plural kinds of EL layer-forming materials, the EL layer including the same EL layer-forming materials at roughly the same weight ratio as the material layer can be formed over the deposition target substrate. As described above, in the case where plural kinds of EL layer-forming materials having different evaporation temperatures are deposited, the deposition method according to Embodiment 1 does not need control of the evaporation rate of each EL layer-forming material, unlike the case of co-evaporation. Thus, without complicated control of the evaporation rate or the like, a desired layer containing different EL layer-forming materials can be formed easily and accurately.

Further, application of the deposition method described in Embodiment 1 facilitates formation of a fine pattern of a light-emitting layer; thus, it also facilitates manufacture of a light-emitting device. In addition, since the fine pattern can be formed, a high-definition light-emitting device can be obtained. Furthermore, by application of Embodiment 1, not only a laser but also a lamp heater or the like which is inexpensive but provides a large amount of heat can be used as the light source. Moreover, by use of a lamp heater or the like as the light source, a film can be formed on a large area at a time; thus, cycle time can be shortened. Thus, productivity can be improved to reduce manufacturing costs of a light-emitting device.

Moreover, by the deposition method according to Embodiment 1, a desired EL layer-forming material can be deposited to the deposition target substrate without being wasted. Thus, use efficiency of the EL layer-forming material is increased, and costs can be reduced. In addition, the EL layer-forming material can be prevented from being attached to the inner wall of the deposition chamber, and maintenance of the deposition apparatus can be easier.

Accordingly, by application of Embodiment 1, it becomes easier to form a desired layer including different EL layer-forming materials and it becomes possible to improve productivity in manufacturing a light-emitting device or the like by using the layer including different EL layer-forming materials.

Further, since the deposition donor substrate of Embodiment 1 can be easily manufactured, the costs of the deposition donor substrate can be reduced. Accordingly, manufacturing costs of a light-emitting device can also be reduced. Furthermore, a deposition donor substrate that has been used once for deposition in Embodiment 1 can be used again after the material layer is removed and a new material layer is formed. Accordingly, the costs spent on manufacturing a light-emitting device can be reduced. For the deposition donor substrate described according to Embodiment 1, a glass substrate or a quartz substrate is preferably used as the supporting substrate. Since an impurity (such as moisture) is less likely to be adsorbed or attached to such a substrate than to a film substrate or the like, a glass substrate or a quartz substrate is suitable for reuse.

Further, with the use of the deposition donor substrate according to Embodiment 1, an EL layer-forming material can be formed with high use efficiency, and costs can be reduced. In addition, with the use of the deposition donor substrate of Embodiment 1, a film having a desired shape can be formed with high accuracy.

Note that Embodiment 1 can be combined with any other embodiment described in this specification as appropriate.

(Embodiment 2)

In Embodiment 2, a deposition donor substrate which differs in structure from the deposition donor substrate in the above Embodiment 1 will be described. Note that the deposition donor substrate described in Embodiment 2 is formed using a material and a manufacturing method that are similar to those of Embodiment 1 if not otherwise stated.

FIG. 2A illustrates an example of a deposition donor substrate 130 according to Embodiment 1. In FIG. 2A, on the first substrate 101 which is a supporting substrate, the light-absorbing layers 103 which are island shaped or stripe shaped are provided so that they are separated from each other. Further, the partition layers 105 are each formed between the light-absorbing layers 103. Furthermore, reflective layers 109 are formed on the light-absorbing layers 103 and on the partition layers 105. The material layers 107 to which an EL layer-forming material is attached are formed on the light-absorbing layers 103 and on the partition layers 105 with the reflective layers 109 interposed therebetween.

The reflective layers 109 reflect light with which the material layers 107 that are overlapped with the partition layers 105 are irradiated, so that theses material layers 107 are not heated during evaporation. Therefore, the reflective layers 109 are preferably formed using a material having high reflectance for irradiation light. Specifically, the reflective layers 109 are preferably formed using a material having a reflectance of 85% or more, more preferably, a reflectance of 90% or more for irradiation light. For example, in the case of irradiation of light in the infrared region which has a wavelength of 800 to 2500 nm, as a material for the reflective layers, aluminum, silver, gold, platinum, copper, an alloy containing aluminum, an alloy containing silver, indium oxide-tin oxide, or the like can be preferably used. In particular, aluminum-titanium alloy, aluminum-neodymium alloy, or silver-neodymium alloy has high reflectance for light in the infrared region (which has a wavelength of 800 nm or more) and thus can be suitably used for the reflective layers. For example, when formed to a thickness of 400 nm, an aluminum-titanium alloy film exhibits a reflectance of 85% or more for light throughout the infrared region (which has a wavelength of from 800 to 2500 nm) and in particular, a reflectance of 90% or more for light in the region at a wavelength of from 900 nm to 2500 nm. Note that what kind of material is preferable for the reflective layer 109 varies depending on the wavelength of light with which the first substrate 101 is irradiated. Further, each reflective layer is not limited to a single layer and may include plural layers.

Note that a difference between the reflectances of the reflective layer 109 and the light-absorbing layer 103 is preferably large. Specifically, the difference in the reflectances each of which depends on the wavelength of irradiation light is preferably 25% or more, more preferably, 30% or more.

Note that the reflective layers 109 can be formed by any of a variety of methods. For example, the reflective layers 109 can be formed by a sputtering method, an electron beam evaporation method, a vacuum evaporation method, or the like. In addition, the thickness of each reflective layer is preferably about greater than or equal to 100 nm and less than or equal to 2 μm although it depends on a material. With a thickness of 100 nm or more, transmission of irradiation light through the reflective layers can be suppressed. Note that because of the difference in thickness between the light-absorbing layer 103 and the partition layer 105 and because of the inverse taper shape of the partition layer 105, the reflective layers 109 can be formed so that they are separated from each other. Therefore, there is no need for a photolithography process for forming the reflective layers 109 so that they are separated from each other.

Next, as illustrated in FIG. 2B, the second substrate 201 which is the deposition target substrate is disposed to face the surface of the first substrate 101 on which the light-absorbing layers 103, the partition layers 105, the reflective layers 109, and the material layers 107 are formed. The second substrate 201 is the deposition target substrate over which a desired layer is to be formed by an evaporation process.

The second substrate 201 is provided with a first electrode layer 203. Edge portions of the first electrode layer 203 are preferably covered with an insulator 205. In Embodiment 1, the first electrode layer represents an electrode which serves as an anode or a cathode of a light-emitting element.

After the first substrate 101 and the second substrate 201 are disposed, light irradiation is performed from the rear surface of the first substrate 101, that is, from a surface opposite the surface where the material layers are formed, as illustrated in FIG. 2C. Irradiation light is absorbed by the light-absorbing layer 103. Light absorbed is converted to heat energy, which is conducted to the reflective layers 109 that are in contact with the light-absorbing layers 103 to heat the material layers 107 that are formed over the light-absorbing layers 103 with the reflective layers 109 interposed therebetween. This allows the EL layer-forming material to be attached to the first electrode and deposited to form the EL layer 207.

Note that, in some cases, irradiation light is transmitted through the partition layers 105 to heat the material layers 107 that are formed on the partition layers 105. However, in the deposition donor substrate 130 according to Embodiment 2, the material layers 107 that are formed on the partition layers 105 can be prevented from being heated, since light can be reflected by the reflective layers 109 that are formed on the partition layers 105.

Further, according to the deposition donor substrate of Embodiment 2, because of the inverse taper shape of the partition layer 105, the partition layer 105 and the light-absorbing layer 103 are not in contact with each other and have a space therebetween. Since heat conduction is more difficult in gas than in solid, the existence of the space can suppress conduction of heat generated in the light-absorbing layers in a horizontal direction, so that the material layers 107 that are formed on the partition layers 105 can be prevented from being heated. Since heat conduction is further difficult under a reduced pressure, evaporation is preferably performed under a reduced pressure or in vacuum.

Further, in some cases, the partition layers 105 are heated when the first substrate 101 is irradiated with light. However, the material layers 107 that are formed on the partition layers 105 can be prevented from being heated, since the deposition donor substrate according to Embodiment 1 has the partition layers 105 which are formed using a material having lower heat conductivity than that of the material for the light-absorbing layers 103 and have a large thickness. This makes it possible to heat only the material layers 107 that are overlapped with the light-absorbing layers 103 so that the EL layer 207 having a desired pattern can be formed over the second substrate.

In addition, since the partition layer 105 with a thickness greater than or equal to 1 μm and less than or equal to 2 μm can ensure the distance between the light-absorbing layer 103 which is a heat source and the deposition target substrate, defective deposition caused when the second substrate 201 is heated due to heat from the light-absorbing layer 103 can be prevented. Furthermore, since a direction in which the material is evaporated from the material layers 107 to the deposition target substrate can be controlled, deformation of the deposition pattern over the deposition target surface can be prevented.

Application of the deposition method described in Embodiment 2 facilitates formation of a pattern of a light-emitting layer; thus, it also facilitates manufacture of a light-emitting device. In addition, since the fine pattern can be formed, a high-definition light-emitting device can be obtained. Furthermore, by application of Embodiment 2, not only a laser but also a lamp heater or the like which is inexpensive but provides a large amount of heat can be used as the light source. Moreover, by use of a lamp heater or the like as the light source, a film can be formed on a large area at a time; thus, cycle time can be shortened. Thus, manufacturing costs of a light-emitting device can be reduced.

Moreover, by the deposition method according to Embodiment 2, a desired EL layer-forming material can be deposited to the deposition target substrate without being wasted. Thus, use efficiency of the EL layer-forming material is increased, and costs can be reduced. In addition, the EL layer-forming material can be prevented from being attached to the inner wall of the deposition chamber, and maintenance of the deposition apparatus can be easier.

Accordingly, by application of Embodiment 2, it becomes easier to form a desired layer including different EL layer-forming materials and it becomes possible to improve productivity in manufacturing a light-emitting device or the like by using the layer including different EL layer-forming materials.

Furthermore, since a pattern of the reflective layers of the deposition donor substrate of Embodiment 2 can be formed without a photolithography process, the number of photo masks can be reduced. Accordingly, the deposition donor substrate of Embodiment 2 can be manufactured at low costs. This contributes to a reduction in costs of a light-emitting device.

Further, with the use of the deposition donor substrate according to Embodiment 2, an EL layer-forming material can be deposited with high use efficiency, and costs can be reduced. In addition, with the use of the deposition donor substrate of Embodiment 2, a film having a desired shape can be formed with high accuracy.

Note that Embodiment 2 can be combined with any other embodiment described in this specification as appropriate.

(Embodiment 3)

In Embodiment 3, a method for manufacturing a light-emitting device capable of full-color display by forming EL layers of light-emitting elements by using a plurality of deposition donor substrates described in Embodiment 1 or 2 will be described.

First, three deposition donor substrates described in Embodiment 1 or 2 are prepared. The deposition donor substrates used in Embodiment 3 are as described with reference to FIGS. 1A to 1C in Embodiment 1. Note that the deposition donor substrates are each provided with material layers in order that EL layer-forming materials included in the material layers form EL layers that exhibit light emission of different colors. Specifically, a first deposition donor substrate provided with material layers (R) including an EL layer-forming material for forming an EL layer that exhibits red light emission (an EL layer (R)), a second deposition donor substrate provided with material layers (G) including an EL layer-forming material for forming an EL layer that exhibits green light emission (an EL layer (G)), and a third deposition donor substrate provided with material layers (B) including an EL layer-forming material for forming an EL layer that exhibits blue light emission (an EL layer (B)) are prepared.

Further, as the deposition target substrate, one second substrate having a plurality of first electrodes is prepared. Note that since edge portions of the plurality of first electrodes formed over the second substrate are covered with an insulator, a light-emitting region corresponds to part of the first electrode which is exposed without being overlapped with the insulator.

First, in a first deposition step, the deposition target substrate and the first deposition donor substrate are overlapped and aligned with each other, as in FIG. 1B. Note that the second substrate is preferably provided with an alignment marker. Also, the first deposition donor substrate is preferably provided with an alignment marker. Note that since the first deposition donor substrate is provided with light-absorbing layers, partition layers, and material layers (R), portions of the light-absorbing layers, partition layers, and material layers (R) which are located near the alignment marker are preferably removed in advance.

Then, light irradiation is performed from the rear surface (surface on which the light-absorbing layers, the partition layers, and the material layers are not formed) side of the first deposition donor substrate. Irradiation light is absorbed by the light-absorbing layers so that heat is conducted to the material layers (R) to heat the EL layer-forming material included in the material layers (R). Accordingly, the EL layer (R) is formed on part of the first electrode over the deposition target substrate. Then, the first deposition donor substrate after the first deposition is completed is moved away from the deposition second substrate.

Next, in a second deposition step, the second substrate and the second deposition donor substrate are overlapped and aligned with each other. In the second deposition donor substrate, the light-absorbing layers are each formed in a position shifted by one pixel from the position of the light-absorbing layer of the first deposition donor substrate used in the first deposition.

Then, light irradiation is performed from the rear surface side of the second deposition donor substrate. Irradiation light is absorbed by the light-absorbing layers so that heat is conducted to the material layers (G) to heat the EL layer-forming material included in the material layers (G). Accordingly, the EL layers (G) are formed on part of the first electrode over the deposition target substrate which is located next to the first electrode that is provided with the EL layers (R) in the first deposition. Then, the second deposition donor substrate after the second deposition is completed is moved away from the second substrate.

Next, in a third deposition step, the second substrate and the third deposition donor substrate are overlapped and aligned with each other. In the third deposition donor substrate, the light-absorbing layers are each formed in a position shifted by two pixels from the position of the light-absorbing layer of the first deposition donor substrate used in the first deposition.

Figure 3A:
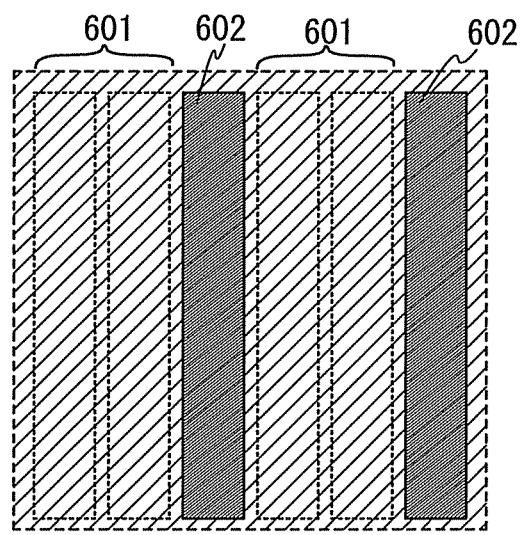
FIGS. 3A to 3C illustrate a method for manufacturing a light-emitting device.

Then, light irradiation is performed from the rear surface side of the third deposition donor substrate. FIG. 3A is a top view illustrating the state right before the third deposition. In FIG. 3A, light-absorbing layers 602 are formed so that they are separated from each other. In addition, the partition layers (not illustrated) are each formed in a region between the light-absorbing layers 602, that is, in a region 601 that is overlapped with the pixel region formed in the first or second deposition step. Further, in regions of the deposition target substrate which are overlapped with the light-absorbing layers of the third deposition donor substrate, the first electrodes are formed. Note that in a region of the deposition target substrate which is overlapped with the region represented by dotted lines in FIG. 3A, the EL layer (R) 603 formed in the first deposition and the EL layer (G) 604 formed in the second deposition are located.

Then, EL layers (B) 605 are formed through the third deposition. Irradiation light is absorbed by the light-absorbing layers so that heat is conducted to the material layers (B) to heat the EL layer-forming material included in the material layers (B). Accordingly, the EL layers (B) 605 are formed on part of the first electrode of the deposition target substrate which is located next to the first electrode that is provided with the EL layers (G) 604 in the first deposition. The third deposition donor substrate after the third deposition is completed is moved away from the deposition target substrate.

In this manner, the EL layer (R) 603, the EL layer (G) 604, and the EL layer (B) 605 can be formed at regular intervals over one deposition target substrate. Then, a second electrode is formed over these layers. Accordingly, light-emitting elements can be formed. Note that in FIGS. 3A and 3B, due to the stripe shaped light-absorbing layers 602, deposition is also performed between the light-emitting regions for emitting light of the same color. However, since the insulator is formed between the light-emitting regions so that the material layers are evaporated to the insulator, the region that is overlapped with the insulator 606 does not become a light-emitting region.

Through the above steps, light-emitting elements which exhibit light emission of different colors are formed over one substrate, whereby a light-emitting device capable of full-color display can be formed.

Figure 3B:
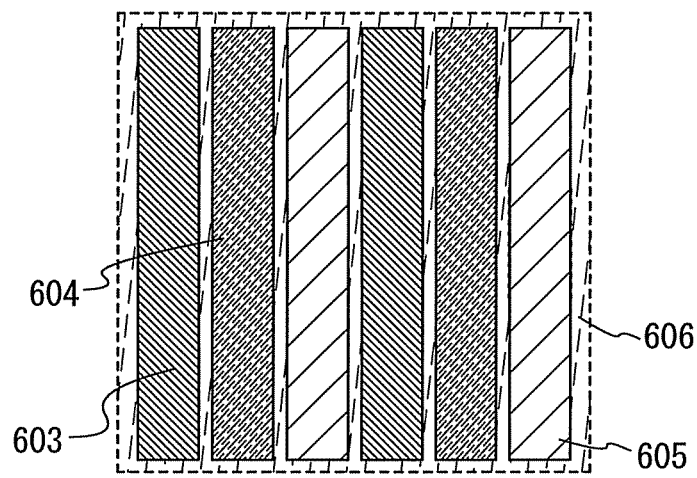
Figure 3C:
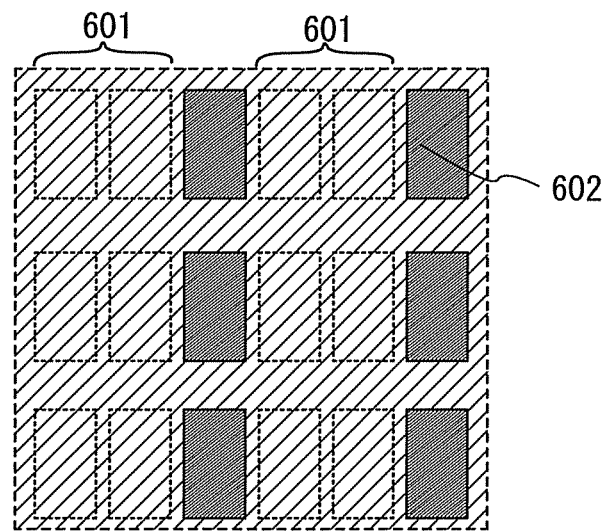

Although FIGS. 3A and 3B illustrate the example in which the light-absorbing layers formed in the deposition donor substrate are stripe shaped, there is no limitation to this example. As illustrated in FIG. 3C, the light-absorbing layers 602 may be island shaped. In FIG. 3C, in the regions 601 that are overlapped with the pixel regions formed in the first or second deposition step, the partition layers are formed. Note that since an insulator is formed between light-emitting regions for emitting light of the same color over the deposition target substrate, the region that is overlapped with the insulator does not become a light-emitting region even when the material layers are evaporated thereon, as described above. Therefore, a partition layer is not necessarily formed between the light-absorbing layers 602 each including the material layer (B).

Figure 4A:
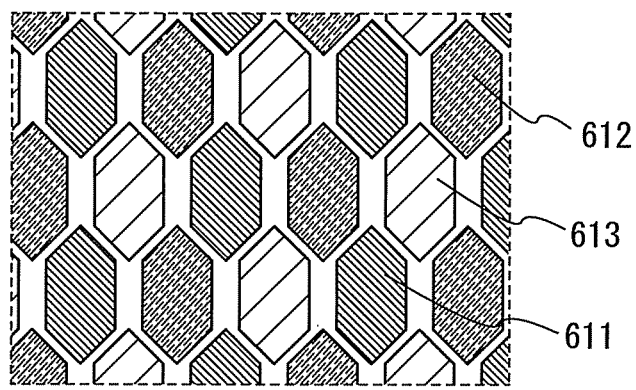
FIGS. 4A and 4B illustrate a method for manufacturing a light-emitting device.
Figure 4B:
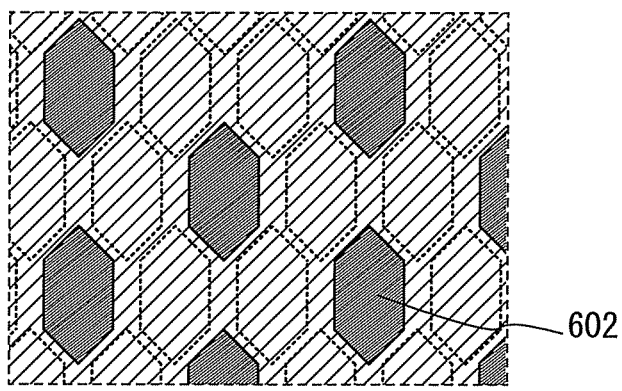

Further, there is no particular limitation on the arrangement of pixels. Each pixel may have a polygonal shape, for example, a hexagonal shape as illustrated in FIG. 4A, and a full-color light emitting device may be realized by arrangement of EL layers (R) 611, EL layers (G) 612, and EL layers (B) 613. Note that in order to form polygonal pixels illustrated in FIG. 4A, deposition may be performed using a deposition donor substrate having the polygonal light-absorbing layers 602 as illustrated in FIG. 4B.

By controlling the thicknesses of the material layers formed in the deposition donor substrate, the thickness of a film formed over the deposition target substrate can be controlled in manufacture of a light-emitting device capable of full color display which is described in Embodiment 3. Therefore, a practitioner does not need to adjust the evaporation rate by using a thickness monitor, and thus the deposition process can be fully automated.

Further, by using the deposition donor substrate described in Embodiment 1 or 2, the EL layer-forming material in the material layers formed in the deposition donor substrate can be uniformly heated during the deposition in manufacture of a light-emitting device capable of full-color display which is described in Embodiment 3. In addition, in the case where the material layers each include plural kinds of EL layer-forming materials, a film containing the same EL layer-forming materials at roughly the same weight ratio as the material layers can be formed over the deposition target substrate. Therefore, in the case where plural kinds of EL layer-forming materials having different evaporation temperatures are deposited, the deposition using the deposition donor substrate according to Embodiment 1 or 2 does not require control of the evaporation rate of each EL layer-forming material, unlike the case of co-evaporation. Thus, without complicated control of the evaporation rate or the like, a desired layer including different EL layer-forming materials can be formed easily and accurately.

Furthermore, in manufacture of a light-emitting device capable of full color display described in Embodiment 3, by using the deposition donor substrate described in Embodiment 1 or 2, a flat and even film can be formed and a fine pattern can also be formed. Accordingly, a light-emitting device with high definition can be obtained, and further the characteristics of the light-emitting device can be improved. Furthermore, by using, for example, a lamp heater with high energy as the light source for deposition, a film can be formed on a large area at a time, which results in a reduction in manufacturing costs of the light-emitting device.

Note that the structure described in Embodiment 3 can be combined with any of the structures described in other embodiments as appropriate.

(Embodiment 4)

In Embodiment 4, an example of a deposition apparatus which enables manufacture of a light-emitting device will be described using FIG. 5. Note that FIG. 5 is a top view illustrating an example of a manufacturing apparatus.

Figure 5:
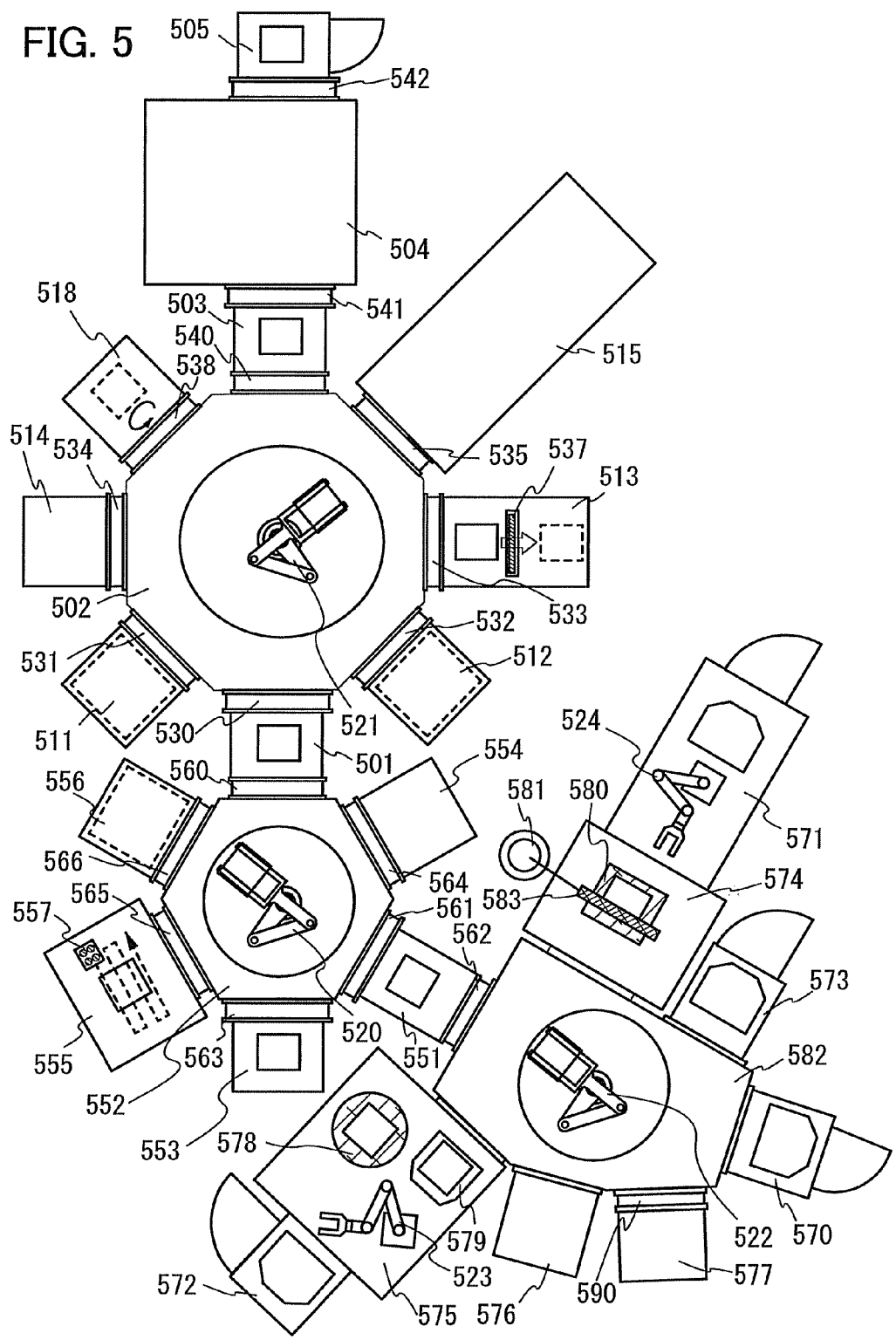
FIG. 5 illustrates a deposition apparatus.

The manufacturing apparatus illustrated in FIG. 5 includes a first transfer chamber 582 and a second transfer chamber 552 which are connected to each other via a first delivery chamber 551. The manufacturing apparatus also includes a third transfer chamber 502 connected to the second transfer chamber 552 via a second delivery chamber 501. The manufacturing apparatus further includes a sealing chamber 504 connected to the third transfer chamber 502 via a third delivery chamber 503.

The second transfer chamber 552, the third transfer chamber 502, and the sealing chamber 504 can each be connected to a vacuum evacuation process chamber and evacuated to vacuum to prevent incorporation of moisture or the like. In addition, after vacuum evacuation, the chambers can be placed under the atmospheric pressure by introduction of an inert gas. For the vacuum evacuation process chamber, a magnetic floating turbo molecular pump, a cryopump, or a dry pump is used. With such a pump, the ultimate vacuum in the transfer chambers connected to other chambers can be set to $10^{-3}$ to $10^{-6}$ Pa, and reverse diffusion of impurities from the pump side and from an evacuation system can be controlled.

First, a first substrate serving as a supporting substrate of a deposition donor substrate is placed in a first cassette chamber 571, a second cassette chamber 572, or a third cassette chamber 573. One chamber is selected from these three cassette chambers according to a film that is to be formed over the deposition donor substrate. On one surface of the supporting substrate, at least light-absorbing layers and partition layers are formed.

In the case where material layers are formed over the supporting substrate with a droplet discharge apparatus, the supporting substrate is set in a face-up mode in the first cassette chamber 571 and is transferred to a process chamber 574 including a droplet discharge apparatus with the use of a transfer unit 524 provided in the first cassette chamber 571, and droplet discharge is performed. The transfer unit 524 can turn a substrate upside down, and the substrate can be transferred upside down into the process chamber 574; therefore, the supporting substrate may be set in a face-down mode in the first cassette chamber 571 in order to prevent dust from attaching to the light-absorbing layers on the supporting substrate.

The process chamber 574 is provided with a droplet discharge unit 583 having a head with a plurality of nozzles arranged in one axial direction, a control portion that controls the droplet discharge unit 583, a stage 580 that fixes a substrate and moves in X, Y, and θ directions, an ink bottle 581 that supplies the droplet discharge unit 583 with a composition, and the like.

After droplet discharge is performed, the supporting substrate is transferred to a bake chamber 576 by using a transfer unit 522 of the first transfer chamber 582 connected to the process chamber 574, and drying or baking is performed. A plurality of substrates can be heated in the bake chamber 576, which can also function as a stock chamber for stocking supporting substrates.

Alternatively, in the case where the material layers are formed over the entire surface of the supporting substrate with a coating apparatus by a spin coating method, a spray method, or the like, the supporting substrate is set in a face-up mode in the second cassette chamber 572 and is transferred to a process chamber 575 having a coating apparatus with the use of a transfer unit 523 provided in the process chamber 575, and coating is performed. The transfer unit 523 can also turn a substrate upside down, and the substrate can be placed upside down onto a stage 578; therefore, the supporting substrate may be set in a face-down mode in the second cassette chamber 572 in order to prevent dust from attaching to the light-absorbing layers on the supporting substrate.

The process chamber 575 is provided with a nozzle that drips a material liquid, the stage 578 that fixes a substrate and rotates, a control portion that controls the number of rotations of the stage, a stage 579 on which a substrate coated with the material liquid is placed, a tank that supplies the nozzle with the material liquid, and the like.

After droplet discharge is performed, the supporting substrate is transferred to the bake chamber 576 by using the transfer unit 522 of the first transfer chamber 582 connected to the process chamber 575, and drying or baking is performed.

In the case where a resistance heating method is used to form the material layers over the supporting substrate, the supporting substrate is set in a face-down mode in the third cassette chamber 573 and is transferred to the first delivery chamber 551 with the use of the transfer unit 522 of the first transfer chamber 582 connected to the third cassette chamber 573. Further, the supporting substrate is transferred to a pretreatment chamber 553 by using a transfer unit 520 provided in the second transfer chamber 552 connected to the first delivery chamber 551, and in order to thoroughly remove moisture or gases from the substrate, annealing for degasification is performed in vacuum (of $5 \times 10^{-3}$ Pa or less, preferably $10^{-6}$ to $10^{-4}$ Pa). Then, the supporting substrate is transferred to a process chamber 555 by using the transfer unit 520, and evaporation is performed by a resistance heating method.

The process chamber 555 is provided with a unit for moving an evaporation source 557 along a path designated by a dotted line in the chamber, a unit for fixing a substrate, a thickness monitor, a vacuum evacuation process chamber, and the like. The evaporation source 557 is provided with a plurality of crucibles, and EL layer-forming materials in the crucibles are heated by a resistance heating method. In the process chamber 555, the evaporation source is moved under the substrate set in a face-down mode, thereby performing evaporation. In the case where deposition is performed as selected using an evaporation mask, an evaporation mask stocked in a process chamber 554 may be transferred to the process chamber 555, and the evaporation mask may be aligned with the substrate, and evaporation may be performed.

The deposition donor substrate is set in the first cassette chamber 571, the second cassette chamber 572, or the third cassette chamber 573 and is provided with the material layers as appropriate in the process chamber. Then, the deposition donor substrate is transferred to the third transfer chamber 502 and is further transferred to a light irradiation chamber 515 by using a transfer unit 521 provided for the third transfer chamber 502, with a surface provided with the material layers up, i.e., in a face-up mode. Note that when the material layers of the deposition donor substrate are formed by an evaporation method, the surface provided with the material layers faces downward after the deposition; therefore, in such a case, the substrate is turned upside down with a substrate turning mechanism provided in a process chamber 518 and is then transferred to the light irradiation chamber 515.

The process chamber 518 may be used not only to turn a substrate upside down but also to stock the plurality of substrates. If the transfer unit 521 can turn a substrate upside down, the substrate turning mechanism is not necessarily provided in the process chamber 518, and the process chamber 518 may be used to stock the plurality of substrates.

Further, a second substrate serving as a deposition target substrate is set in a face-down mode in a fourth cassette chamber 570 and is transferred to the first delivery chamber 551 by using the transfer unit 522 of the first transfer chamber 582 connected to the fourth cassette chamber 570. Furthermore, the second substrate is transferred to the pretreatment chamber 553 by using the transfer unit 520 provided in the second transfer chamber 552 connected to the first delivery chamber 551, and in order to thoroughly remove moisture or gases from the second substrate, annealing for degasification is performed in vacuum. In particular, in the case where a TFT is formed over the second substrate, if an organic resin material is used as a material of an interlayer insulating film or a partition, some organic resin materials adsorb moisture easily and degasification can be caused; thus, it is effective to perform vacuum heating in which adsorbed moisture is removed by heating the second substrate at 100 to 350° C., preferably at 150 to 200° C. for 30 minutes or more, for example, and cooling down the second substrate naturally for 30 minutes before a layer including the organic resin material is formed.

When a passive-matrix light-emitting device is manufactured, at least first electrodes that are stripe shaped are formed over the second substrate in advance. When an active-matrix light-emitting device is manufactured, first electrodes and switching elements that are electrically connected to the first electrodes, such as thin film transistors in which an amorphous semiconductor film, a polycrystalline semiconductor film, a microcrystalline semiconductor film, or a single crystal semiconductor film functions as an active layer, are formed over the second substrate in advance.

After that, the second substrate which is the deposition target substrate is transferred to the second delivery chamber 501 by using the transfer unit 520 and is further transferred to the light irradiation chamber 515 by using the transfer unit 521 provided in the third transfer chamber 502 connected to the second delivery chamber 501, with a surface provided with the first electrodes facing downward, i.e., in a face-down mode.

After being transferred to the light irradiation chamber 515, the deposition donor substrate is aligned with the second substrate which is the deposition target substrate so that they face each other, and the substrates are held at a certain distance d with a pair of substrate holding units. Then, the pair of substrates is irradiated with light; thus, the EL layer is formed.

Figure 6:
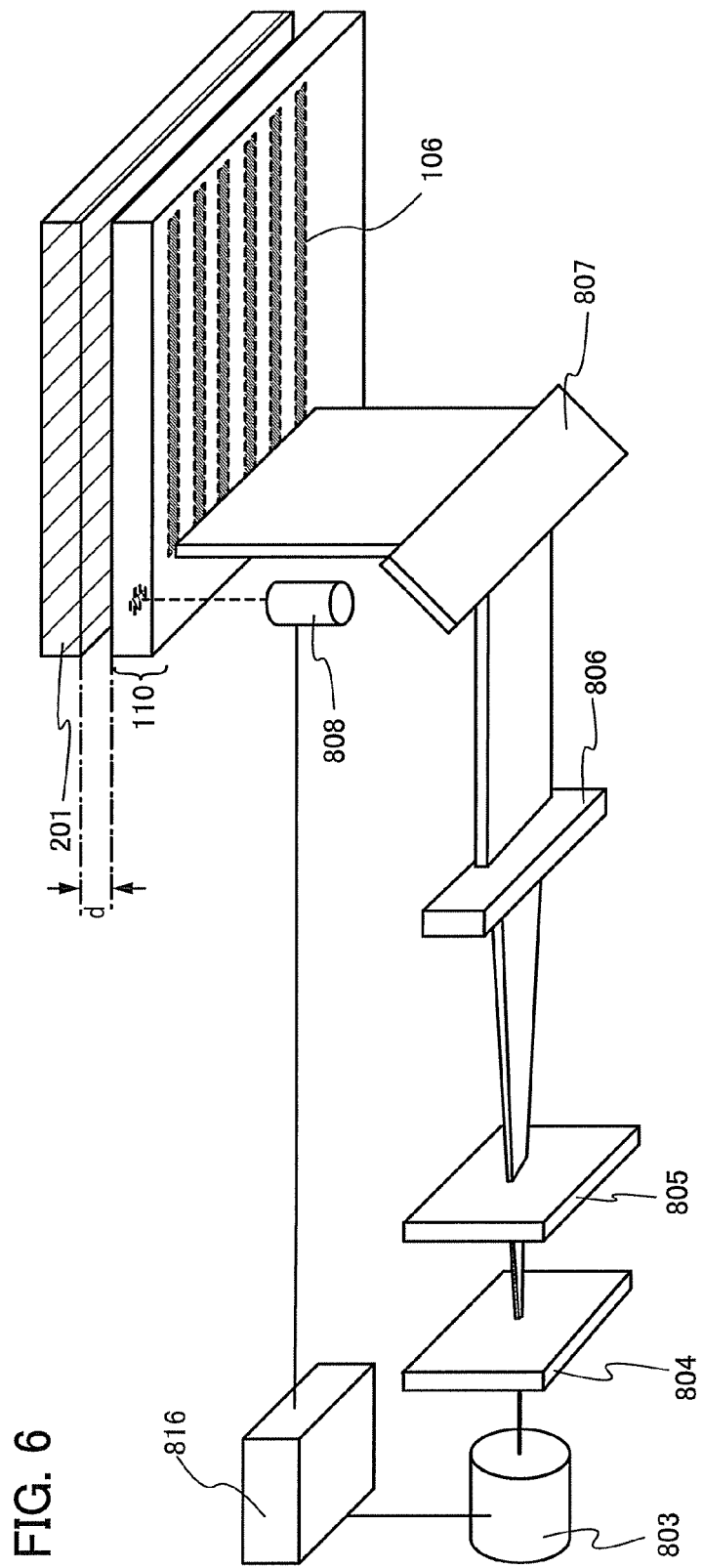
FIG. 6 illustrates a deposition apparatus.

Here, FIG. 6 is a schematic diagram illustrating a positional relationship between the deposition donor substrate 110 and the light source during the deposition. In Embodiment 4, a laser device 803 is used as the light source. However, there is no limitation on the light source as long as it is a heating unit capable of uniform heating for a short time. When a large surface is to be irradiated, a lamp with which light irradiation can be performed at a time is preferable to a laser.

Laser light emitted is output from the laser device 803 and is transmitted through optical systems 804, 805, and 806 for changing a beam shape into a linear shape. The optical path of the laser light is bent in a direction perpendicular to the deposition donor substrate 110 by a reflecting mirror 807. Then, the light-absorbing layers 106 provided on the deposition donor substrate 110 is irradiated with a laser beam. Note that the deposition donor substrate may be irradiated with a laser beam through a window, which may be the same size as or smaller than the width of the laser beam to function as a slit.

Note that the pair of substrate holding units for moving the pair of substrates is preferably controlled by a control device 816. Furthermore, the control device 816 is preferably designed to be able to control the laser device 803. Further, the control device 816 preferably works with a position alignment mechanism which has an image pickup element for detecting a position marker.

With the deposition donor substrate described in Embodiment 1 or 2, by light irradiation, only the material layers that are overlapped with the light-absorbing layers are sublimed and deposited to the deposition target substrate disposed to face the deposition donor substrate.

The deposition donor substrate which has undergone evaporation can be used again after being collected and stripped of the remaining material layer. The deposition donor substrate which has undergone evaporation is transferred to a cleaning chamber 577 and stripped of the remaining material layer. Washing of the remaining material layer can be performed by wet etching but preferably by dry etching using $O_2$ plasma. By applying dry etching using $O_2$ plasma to the washing of the material layer, formation of the material layers, formation of the EL layer, and washing of the remaining material layer can be all performed under a reduced pressure. Thus, the deposition donor substrate can be used plural times without being taken out of the deposition apparatus. This leads to a reduction in costs of a light-emitting device.

Through the above steps, material layers having a single layer structure can be deposited as selected to the deposition target substrate. For deposition of a stack of layers, a second deposition donor substrate is prepared in advance; the first deposition donor substrate which has undergone laser light scanning is replaced with the second deposition donor substrate; the second deposition donor substrate is aligned with the deposition target substrate so that they face each other in the light irradiation chamber 515; and the distance between the substrates is kept constant with the pair of substrate holding units. Then, the pair of substrates is irradiated with light; thus, the EL layer is formed.

Note that the second deposition donor substrate is provided with at least light-absorbing layers and partition layers on one surface. In a manner similar to that of the first deposition donor substrate, the second deposition donor substrate is set in the first cassette chamber 571, the second cassette chamber 572, or the third cassette chamber 573, and material layers are formed as appropriate in the process chamber.

In order that another layer be further stacked in the light irradiation chamber 515, a third deposition donor substrate is transferred into the light irradiation chamber 515 without taking the deposition target substrate out of the light irradiation chamber 515; the third deposition donor substrate is aligned with the deposition target substrate so that they face each other; and light irradiation is performed. Thus, the EL layer is formed. Through similar steps, a stack of four or more layers can be formed.

In the case of deposition using the light irradiation chamber 515, the first deposition donor substrate, the second deposition donor substrate, the third deposition donor substrate, and the like are each provided with material layers and stocked in the process chamber 518 in advance, and, after the deposition target substrate is transferred into the light irradiation chamber 515, the first to third deposition donor substrates are successively replaced one by one to form a stack of layers; thus, the steps can proceed efficiently. In the case of a deposition method in which material layers formed in advance over a substrate that is different from a deposition target substrate is heated with light, since the amount of material necessary for deposition is suppressed and a smaller amount of the material is evaporated than that in the case of a conventional resistance heating method, a plurality of transfer robots, alignment units, units for moving a substrate, or the like can be provided in the light irradiation chamber 515 where deposition is performed. Further, the deposition method, in which material layers formed in advance over a substrate that is different from a deposition target substrate is heated with light, can prevent different light-emitting materials from mixing even if different light-emitting layers are formed in the same process chamber (light irradiation chamber 515).

When five or more layers are formed as an EL layer included in a light-emitting element, it is possible to form all the layers of the EL layer with the use of the light irradiation chamber 515; at least one layer may be formed using the light irradiation chamber 515.

For example, a stack of a hole-inject layer and a hole-transport layer is formed on the first electrodes with the use of the light irradiation chamber 515, red light-emitting layers and green light-emitting layers can be formed as selected and blue light-emitting layers may be formed in a process chamber 512 by a resistance heating method in which a substrate is rotated. In the case where blue light-emitting layers are formed as selected, an evaporation mask stocked in the process chamber 554 may be transferred to the process chamber 512 and aligned with the deposition target substrate, and evaporation may be performed. An evaporation source, a unit for rotating a substrate, a unit for alignment with an evaporation mask, a thickness monitor, and the like are provided in the process chamber 512.

Alternatively, in the case where an electron-transport layers or an electron-inject layer is formed by a resistance heating method, the layer may be formed in a process chamber 513. The process chamber 513 is provided with a unit for moving the deposition target substrate in a direction designated by the arrow over an evaporation source 537 in the chamber, a vacuum evacuation process chamber, a thickness monitor, and the like. The evaporation source 557 has a long linear shape, and an EL layer-forming material is heated by a resistance heating method. In order that deposition be performed as selected, an evaporation mask stocked in the process chamber 554 may be transferred to the process chamber 513, aligned with the deposition target substrate, and fixed, and then evaporation may be performed with the deposition target substrate and the evaporation mask being moved.

Further alternatively, in the case where a hole-inject layers or a hole-transport layer is formed by a resistance heating method, the layer may be formed in the process chamber 555.

Alternatively, in the case where red light-emitting layers are formed by a resistance heating method, these layers may be formed in a process chamber 511. Further alternatively, in the case where green light-emitting layers are formed by a resistance heating method, these layers may be formed in a process chamber 556. Each of the process chambers 511 and 556 is provided with an evaporation source, a unit for rotating a substrate, a unit for alignment with an evaporation mask, a vacuum evacuation process chamber, a thickness monitor, and the like. Note that although the example in which light-emitting layers for different emission colors are formed in their respective process chambers 556, 511, and 512 is described in Embodiment 4, there is no particular limitation to this example. For example, the red light-emitting layers may be formed in the process chamber 555 or 513, and a practitioner can select a chamber as appropriate. Further, needless to say, the hole-inject layer, the hole-transport layer, the electron-transport layer, or the electron-inject layer may be formed in the process chamber 556, 511, or 512.

Further, the example is described in which the deposition target substrate is set in the fourth cassette chamber 570 and then transferred to the second transfer chamber 552 without being transferred to another process chamber. However, the deposition target substrate may undergo deposition in the process chamber 575 or 574 before being transferred to the second transfer chamber 552, and be transferred to the light irradiation chamber 515, so that layers may be stacked. In such a case, a film of, for example, a high molecular compound such as poly(3,4-ethylenedioxythiophene)/poly(styrenesulfonate) (PEDOT/PSS) can be formed for the hole-inject layer over the first electrode by wet coating. As a substance having a high hole-transport property which is used for the hole-inject layer, any of various compounds such as high molecular compounds (e.g., oligomers, dendrimers, or polymers) can be used.

Since a film of PEDOT/PSS which is formed by a spin coating method is formed over the entire surface, it is preferable to remove the film at a side face or in a peripheral portion of the deposition target substrate, in a terminal portion, in a region in which a cathode (second electrode) and a lower wiring are connected, and the like, as selected. For this removal, $O_2$ ashing or the like using a mask in the pretreatment chamber 553 is preferable. A plasma producing unit is provided in the pretreatment chamber 553, and one or a plurality of gases selected from Ar, H, F, and O are excited to produce plasma, thereby performing dry etching. The use of a mask enables only an unnecessary portion to be removed. Further, the pretreatment chamber 553 may be provided with a UV irradiation mechanism so that ultraviolet ray irradiation can be performed as surface treatment for an anode (first electrode). Thus, preferably, in the pretreatment chamber 553, not only vacuum heating but also another treatment such as plasma treatment or UV irradiation treatment can be performed.

After completion of the formation of the EL layers over the deposition target substrate through any one of the deposition steps described above, electrodes which function as the second electrodes of the light-emitting elements is formed. Note that the second electrodes are formed by a sputtering method, an electron beam method, or the like. If a sputtering method is employed, a process chamber 514 is provided with a plasma producing unit, a sputtering target, and a unit for introducing a source gas. Since a face-down mode is employed for deposition by a sputtering method or an electron beam method, the deposition target substrate can be smoothly transferred out of the light irradiation chamber 515 or the process chamber in which a resistance heating method is used.

After the second electrodes are formed, the deposition target substrate is transferred to the third delivery chamber 503 through a gate valve 540 by using the transfer unit 521 and further to the sealing chamber 504 through a gate valve 541. The substrate which has undergone sealing in the sealing chamber 504 is transferred to an unload chamber 505 through a gate valve 542 and can be taken out of the manufacturing apparatus. Through the above steps, light-emitting diodes (also referred to as EL elements) can be manufactured.

Note that in the manufacturing apparatus illustrated in FIG. 5, the process chambers and the transfer chambers in which the pressure is reduced are provided with gate valves 530 to 535, 538, 560 to 566, 590.

Such a deposition apparatus can be used to manufacture a light-emitting device. With the use of the deposition apparatus described in Embodiment 4, deposition donor substrates that are provided with material layers in advance are prepared and replaced one by one, whereby successive deposition to a deposition target substrate can be achieved. Accordingly, the time it takes for deposition (cycle time) can be shortened, and productivity can be improved.

By application of Embodiment 4, it becomes possible to form a flat and uniform film. It also becomes possible to form a fine pattern and to suppress blur where undesired deposition is performed in addition to deposition forming a desired pattern. Therefore, a high-definition light-emitting device can be obtained.

According to the deposition method described in Embodiment 4, unlike in the case of forming an EL layer by a wet process, there is no need to consider solubility or the like of a previously formed layer; thus, there is a wider choice of deposition materials. In addition, the number of stacked layers can be freely set. Thus, a desired light-emitting device having a stack structure can be formed using desired materials. It is important in terms of improvement in performance of a light-emitting device that the material or stack structure used can be freely designed particularly when the size of a substrate is increased.

Further, the thickness of a film formed over a deposition target substrate can be controlled by controlling the thicknesses of material layers formed over a deposition donor substrate. Thus, a thickness monitor is not necessary during deposition to the deposition target substrate. Therefore, a practitioner does not have to adjust deposition rate by using a thickness monitor, and the deposition step can be fully automated. Accordingly, productivity can be improved.

By application of Embodiment 4, a material included in material layers formed over a deposition donor substrate can be uniformly deposited. Even in the case where the material layers each include plural kinds of materials, a film including the same materials as the material layers at approximately the same weight ratio can be formed over a deposition target substrate. Accordingly, by the deposition method according to Embodiment 4, even in the case of deposition of plural kinds of materials which vaporize at different temperatures, a desired layer including different materials can be formed easily and accurately without any complicated control of evaporation rate or the like.

Note that the structure described in Embodiment 4 can be combined with any of the structures described in other embodiments as appropriate.

(Embodiment 5)

In Embodiment 5, an apparatus will be described, which is used in the case where an deposition donor substrate including material layers is irradiated with lamp light as a light source according to the deposition method described in Embodiment 4.

Figure 7:
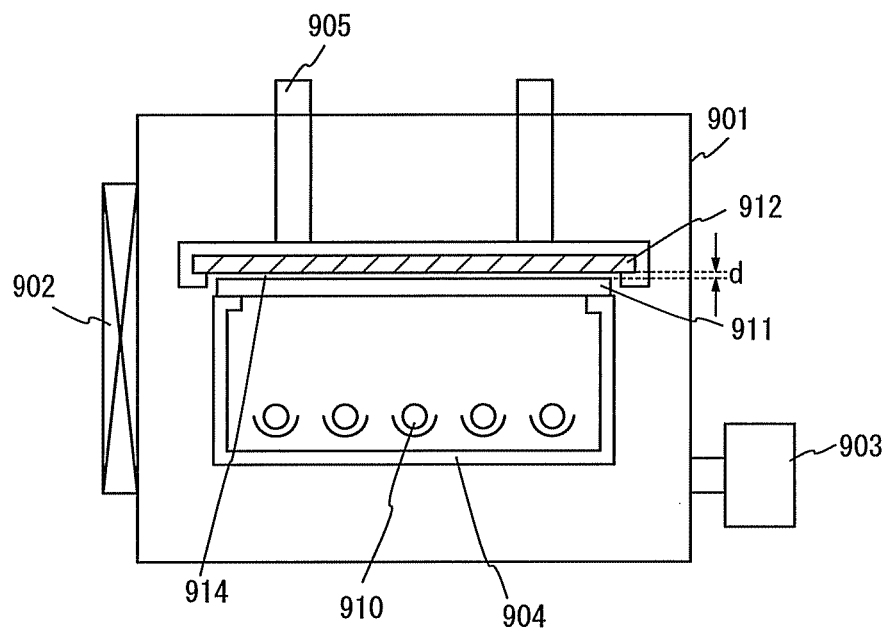
FIG. 7 illustrates a deposition apparatus.

In FIG. 7, a light irradiation chamber 901 which is a vacuum chamber is connected to another process chamber via a gate valve 902 and further provided with an exhaust mechanism 903. In addition, the light irradiation chamber 901 includes at least a substrate stage 904 for holding a deposition donor substrate 911 (including material layers 913), a substrate supporting mechanism 905 for holding a deposition target substrate 912, and a light source 910. Note that the light irradiation chamber 901 and gate valve 902 in FIG. 7 correspond respectively to the light irradiation chamber 515 and gate valve 535 in FIG. 5.

Note that after the material layers of the deposition donor substrate 911 held on the substrate stage 904 are formed in another process chamber, the deposition donor substrate 911 is transferred to the light irradiation chamber 901 and then set on the substrate stage 904. The deposition target substrate 912 is fixed to the substrate supporting mechanism 905 so that a surface of the deposition donor substrate 911 on which the material layers 913 are formed faces a deposition target surface of the deposition target substrate 912.

The substrate supporting mechanism 905 is moved so that the distance between the deposition donor substrate 911 and the deposition target substrate 912 gets shorter and becomes a distance d. Note that the distance d is from 0 mm to 2 mm, preferably from 0 mm to 0.05 mm, more preferably from 0 mm to 0.03 mm.

Although FIG. 7 illustrates an example in which the substrate supporting mechanism 905 is moved while the substrate stage 904 is fixed to control the distance between the substrates, a structure may also be employed in which the substrate stage 904 is moved while the substrate supporting mechanism 905 is fixed. Alternatively, both the substrate stage 904 and the substrate supporting mechanism 905 may be moved. Note that FIG. 7 illustrates a cross section where the substrate supporting mechanism 905 is moved so that the deposition donor substrate 911 and the deposition target substrate 912 are disposed close to each other to have the distance d therebetween.

The substrate stage 904 and the substrate supporting mechanism 905 may have a mechanism capable of not only vertical movement but also horizontal movement for precise alignment. In addition, the light irradiation chamber 901 may include an alignment mechanism such as CCD for precise alignment or measurement of the distance d. In addition, a sensor for measuring the temperature or humidity inside the light irradiation chamber 901 may be provided.

Then, light irradiation is performed from the surface side of the deposition donor substrate 911 on which the material layers are not formed. Thus, the material layers that are overlapped with the light-absorbing layers are heated for a short time, whereby the EL layer is formed over the deposition target surface of the deposition target substrate 912 placed to face the material layers. Because of the inverse taper shape of the deposition donor substrate 911, heat conduction from the light-absorbing layers to the partition layers can be suppressed, so that the material layers that are formed on the partition layers can be prevented from being heated.

In addition, in the deposition apparatus illustrated in FIG. 7, if the material layers 913 with a uniform thickness are formed in the deposition donor substrate 911 in advance, a film with a uniform thickness can be deposited to the deposition target substrate 912 without any thickness monitor. Although a substrate is rotated in a conventional evaporation apparatus, the deposition target substrate is fixed during deposition in the deposition apparatus illustrated in FIG. 7; thus, this deposition apparatus is suitable for deposition to a large-sized glass substrate which is easily broken. In addition, in the deposition apparatus in FIG. 7, the deposition donor substrate is also fixed during deposition.

Note that for uniform heating, the contact area of the light source 910 and the deposition donor substrate 911 is preferably large.

In order to reduce an influence of heat on the material layers 913 of the deposition donor substrate 911 by the light source on standby, an openable and closable shutter used for heat insulation may be provided between the light source 910 and the deposition donor substrate 911 during standby (before an evaporation process).

Examples of lamps used for the light source 910 include discharge lamps such as a flash lamp (e.g., a xenon flash lamp or a krypton flash lamp), a xenon lamp and a metal halide lamp, and exothermic lamps such as a halogen lamp and a tungsten lamp. Since a flash lamp is capable of repeatedly emitting very high-intensity light to a large area for a short time (0.1 to 10 msec), it can uniformly and efficiently heat the deposition donor substrate regardless of the area of the deposition donor substrate. Further, heating the deposition donor substrate 911 can be controlled by varying the time interval of light emission. In addition, since a flash lamp has long lifetime and low power consumption on standby for light emission, the running cost can be suppressed. Furthermore, the use of a flash lamp facilitates immediate heating, so that a vertical movement mechanism, a shutter, or the like in the case of using the heater can be simplified. Thus, the size of the deposition apparatus can be further reduced.

Note that although FIG. 7 illustrates the example in which the light source 910 is placed in the light irradiation chamber 901, part of the inner wall of the light irradiation chamber may be formed using a light-transmitting member and the light source 910 may be placed outside the light irradiation chamber. When the light source 910 is placed outside the light irradiation chamber 901, maintenance such as replacement of light bulbs of the light source 910 can be facilitated.

Further, a mechanism for controlling the temperature of the deposition target substrate 912 may be provided. In the case where a cooling mechanism is provided as the mechanism for controlling the temperature, for example, the substrate supporting mechanism 905 is provided with a tube through which a heating medium flows. By the flow of a coolant as the heating medium through the tube, the substrate supporting mechanism 905 can be a cold plate. Provision of the cooling mechanism in this manner is useful for forming a stack of different material layers. On the other hand, when a heating mechanism is provided, the substrate supporting mechanism 905 may be provided with a heating unit such as a heater. Provision of the mechanism for controlling the temperature (heating or cooling) of the deposition target substrate 912 as described above can also prevent warp or the like of the substrate.

Note that although FIG. 7 illustrates the deposition apparatus employing a face-down system in which the deposition target surface of the deposition target substrate 912 faces downward, a deposition apparatus employing a face-up system in which the deposition target surface of the deposition target substrate 912 faces upward can also be used. Further, although FIG. 7 illustrates the example of the deposition apparatus in which substrates are horizontally placed, a deposition apparatus in which substrates are vertically placed can also be used.

By using such a deposition apparatus, the material layers of the deposition donor substrate can be evaporated to the deposition target substrate.

Note that with the use of lamp light as the light source, a film can be formed on a large area at a time, whereby cycle time can be reduced and manufacturing costs of a light-emitting device can be reduced.

Note that the structure described in Embodiment 5 can be combined with any of the structures described in other embodiments as appropriate.

(Embodiment 6)

In Embodiment 6, a manufacturing method of a light-emitting element and a light-emitting device according to any of the above Embodiments will be described For example, light-emitting elements illustrated in FIGS. 8A and 8B can be manufactured. In the light-emitting element illustrated in FIG. 8A, a first electrode 1002, an EL layer 1003 which includes only a light-emitting layer 1013, and a second electrode 1004 are stacked in this order over a substrate 1001. One of the first electrode 1002 and the second electrode 1004 functions as an anode, and the other functions as a cathode.

Holes injected from the anode and electrons injected from the cathode recombine in the EL layer 1003, whereby light can be emitted. In Embodiment 6, the first electrode 1002 functions as the anode and the second electrode 1004 functions as the cathode.

Figure 8A:
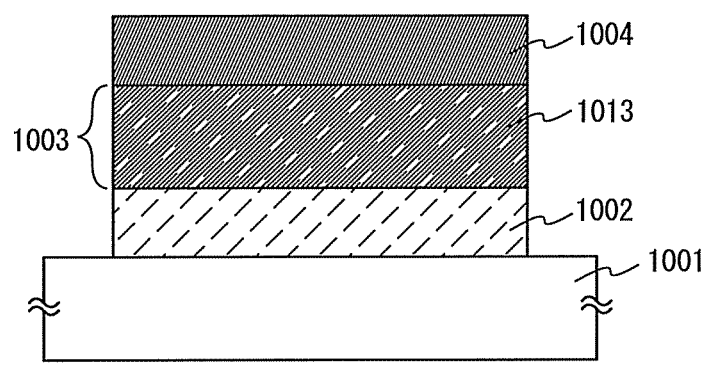
FIGS. 8A and 8B each illustrate a light-emitting element.
Figure 8B:
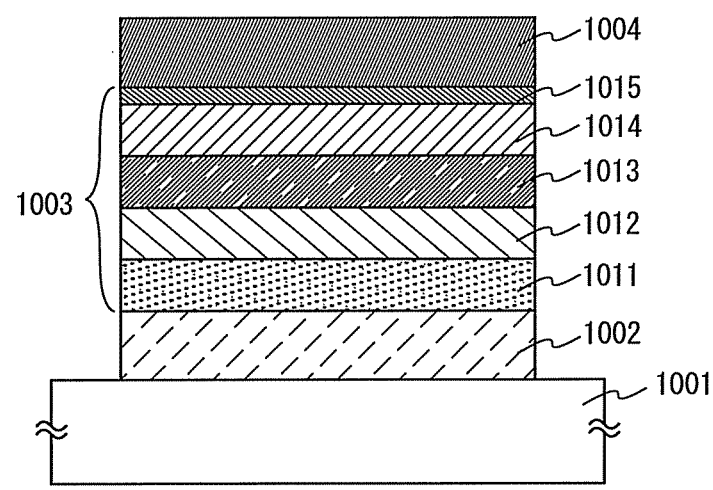

The light-emitting element illustrated in FIG. 8B has a structure in which the EL layer 1003 in FIG. 8A includes a stack of plural layers. Specifically, a hole-inject layer 1011, a hole-transport layer 1012, a light-emitting layer 1013, an electron-transport layer 1014, and an electron-inject layer 1015 are provided in this order from a first electrode 1002 side. Note that the EL layer 1003 functions by including at least the light-emitting layer 1013 as illustrated in FIG. 8A; therefore, all of the above layers are not necessarily provided and may be selected appropriately as needed.

As the substrate 1001 illustrated in FIGS. 8A and 8B, a substrate having an insulating surface or an insulating substrate is employed. Specifically, any of a variety of glass substrates made of glass which are used for the electronics industry, such as aminosilicate glass, aluminoborosilicate glass, and barium borosilicate glass; a quartz substrate; a ceramic substrate; a sapphire substrate; or the like can be used.

For the first electrode 1002 and the second electrode 1004, any of various types of metals, alloys, electrically conductive compounds, mixtures thereof, and the like can be used. Specifically, indium oxide-tin oxide (indium tin oxide, also referred to as ITO), indium oxide-tin oxide including silicon or silicon oxide, indium oxide-zinc oxide (indium zinc oxide, also referred to as IZO), indium oxide including tungsten oxide and zinc oxide, and the like are given, for example. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like are given.

These materials are usually deposited by a sputtering method. For example, a film of indium oxide-zinc oxide can be formed by a sputtering method using a target in which 1 to 20 wt % zinc oxide is added to indium oxide. A film of indium oxide including tungsten oxide and zinc oxide can be formed by a sputtering method using a target in which 0.5 to 5 wt % tungsten oxide and 0.1 to 1 wt % zinc oxide are added to indium oxide. Alternatively, by application of a sol-gel method or the like, the film may be formed by an inkjet method, a spin coating method, or the like.

Furthermore, aluminum (Al), silver (Ag), an alloy including aluminum, or the like can be used. Moreover, any of the following materials having a low work function can be used: an element which belong to Group 1 or Group 2 of the periodic table, that is, an alkali metal such as lithium (Li) or cesium (Cs), an alkaline-earth metal such as magnesium (Mg), calcium (Ca), or strontium (Sr), an alloy thereof (an alloy of aluminum, magnesium, and silver, or an alloy of aluminum and lithium), a rare earth metal such as europium (Eu) or ytterbium (Yb), or an alloy thereof, and the like.

A film of an alkali metal, an alkaline earth metal, or an alloy thereof can be formed by a vacuum evaporation method. In addition, an alloy including an alkali metal or an alkaline earth metal can also be formed by a sputtering method. Further, a film of silver paste or the like can be formed by an inkjet method or the like. The first electrode 1002 and the second electrode 1004 are not limited to a single-layer film and can be formed as a stack of films.

Note that in order to extract light emitted in the EL layer 1003 to the outside, one or both of the first electrode 1002 and the second electrode 1004 are formed so as to transmit light. For example, the first electrode 1002 and the second electrode 1004 are formed using a light-transmitting conductive material such as indium tin oxide. Alternatively, a film of silver, aluminum, or the like is formed to a thickness of several to several tens of nanometers. In addition, the first electrode 1002 and the second electrode 1004 can be formed as a stack structure including a thin film of a metal, such as silver or aluminum, with a small thickness and a thin film of a light-transmitting conductive material such as an ITO film.

Note that the EL layer 1003 (the hole-inject layer 1011, the hole-transport layer 1012, the light-emitting layer 1013, the electron-transport layer 1014, and the electron-inject layer 1015) of the light-emitting element of Embodiment 6 can be formed by applying the deposition method described in Embodiment 1. Furthermore, the electrodes can also be formed by applying the deposition method described in Embodiment 1.

For example, in the case where the light-emitting element illustrated in FIG. 8A is formed, the material layers of the deposition donor substrate described in Embodiment 1 are formed using a material for forming the EL layer 1003, and, by using this deposition donor substrate, the EL layer 1003 is formed over the first electrode 1002 over the substrate 1001. Then, the second electrode 1004 is formed over the EL layer 1003. Thus, the light-emitting element illustrated in FIG. 8A can be formed.

For the light-emitting layer 1013, any of a variety of materials can be used. For example, a fluorescent compound which exhibits fluorescence or a phosphorescent compound which exhibits phosphorescence can be used.

Examples of the phosphorescent compound that can be used for the light-emitting layer 1013 are given below. As light-emitting materials for blue light emission, there are bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIracac), and the like. As light-emitting materials for green light emission, there are tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and the like. As light-emitting materials for yellow light emission, there are bis(2,4-diphenyl-1,3-oxazolato-N,$C^{2'}$)iridium(III) acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), and the like. As light-emitting materials for orange light emission, there are tris(2-phenylquinolinato-N,$C^{2'}$)iridium(D) (abbreviation: Ir(pq)$_3$), bis(2-phenylquinolinato-N,$C^{2'}$)iridium(III)acetylacetonate (abbreviation: Ir(pq)$_2$(acac)), and the like. As light-emitting materials for red light emission, there are organic metal complexes such as bis[2-(2'-benzo[4,5-α]thienyl)pyridinato-N,$C^{3'}$)iridium(III)acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac), (acetylacetonato)bis[2,3-bis(4-fluorophenyl)quinoxalinato] iridium(III) (abbreviation: Ir(Fdpq)$_2$(acac)), and 2,3,7,8,12, 13,17,18-octaethyl-21H,23H-porphine platinum(II) (abbreviation: PtOEP). In addition, rare earth metal complexes such as tris(acetylacetonato)(monophenanthroline)terbium(III)

(abbreviation: Tb(acac)$_3$(Phen)), tris(1,3-diphenyl-1,3-propanedionato)(monophenanthroline)europium(III) (abbreviation: Eu(TTA)$_3$(Phen)), and tris[1-(2-thenoyl)-3,3,3-trifluoroacetonato](monophenanthroline)europium(III) (abbreviation: Eu(TTA)$_3$(Phen)) emit light from a rare earth metal ion (electron transition between different multiplicities); therefore, such rare earth metal complexes can be used as a phosphorescent compound.

Examples of the fluorescent compound that can be used for the light-emitting layer 1013 are given below. As light-emitting materials for blue light emission, there are N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like. As light-emitting materials for green light emission, there are N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As light-emitting materials for yellow light emission, there are rubrene, 5,12-bis(1,1'-biphenyl-4-yl)-6,11-diphenyltetracene (abbreviation: BPT), and the like. As light-emitting materials for red light emission, there are N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), and the like.

Alternatively, for the light-emitting layer 1013, a substance having a high light-emitting property, such as any of the above-described phosphorescent compounds or fluorescent compounds, can be dispersed in another substance, in which case crystallization of the light-emitting layer can be suppressed. Further, concentration quenching due to high concentration of the substance having a high light-emitting property can be suppressed.

As a substance (host material) in which the substance having a high light-emitting property is dispersed, when the substance having a high light-emitting property is a fluorescent compound, a substance having singlet excitation energy (energy difference between a ground state and a singlet excited state) higher than that of the fluorescent compound is preferably used. Alternatively, when the substance having a high light-emitting property is a phosphorescent compound, a substance having triplet excitation energy (energy difference between a ground state and a triplet excited state) higher than that of the phosphorescent compound is preferably used as the host material.

As the host material used for the light-emitting layer 1013, for example, there are 4,4'-di(9-carbazolyl)biphenyl (abbreviation: CBP), 9,9'-(1,3-phenylene)bis(9H-carbazole) (abbreviation: mCP), 2-tert-butyl-9,10-di(2-naphthyl)anthracene (abbreviation: t-BuDNA), 9-[4-(9-carbazolyl)phenyl]-10-phenylanthracene (abbreviation: CzPA), and the like as well as 4,4'-bis[N-(1-naphthyl)-N-phenylamino]biphenyl (abbreviation: NPB), tris(8-quinolinolato)aluminum (III) (abbreviation: Alq), 4,4'-bis[N-(9,9-dimethylfluoren-2-yl)-N-phenylamino]biphenyl (abbreviation: DFLDPBi), bis(2-methyl-8-quinolinolato)(4-phenylphenolato)aluminum (III) (abbreviation: BAlq), and the like.

As the substance (dopant material) having a high light-emitting property which is to be dispersed in the host material, any of the above-mentioned phosphorescent compounds or fluorescent compounds can be used.

When the light-emitting layer 1013 has a structure in which the dopant material is dispersed in the host material, a layer of a mixture of the host material and the dopant material may be formed as the material layers of the deposition donor substrate. Alternatively, a layer including the host material and a layer including the dopant material may be stacked to form the material layers of the deposition donor substrate. By forming the light-emitting layer 1013 using the deposition donor substrate provided with the material layers having such a structure, the light-emitting layer 1013 includes the host material and the dopant material, and has a structure in which the dopant material is dispersed in the host material. Note that, for the light-emitting layer 1013, two or more kinds of host materials and a dopant material may be used, or two or more kinds of dopant materials and a host material may be used. Alternatively, two or more kinds of host materials and two or more kinds of dopant materials may be used.

Furthermore, in the case where the light-emitting element illustrated in FIG. 8B is formed, deposition donor substrates provided with material layers according to Embodiment 1 which include different materials for forming their respective layers in the EL layer 1003 (the hole-inject layer 1011, the hole-transport layer 1012, the electron-transport layer 1014, and the electron-inject layer 1015) are prepared, and used for deposition of the layers by the method described in Embodiment 1. Thus, the EL layer 1003 is formed over the first electrode 1002 over the substrate 1001. Then, the second electrode 1004 is formed over the EL layer 1003. Accordingly, the light-emitting element illustrated in FIG. 8B can be formed. Note that in this case, the method described in Embodiment 1 or 2 can be used for all the layers in the EL layer 1003 but may be used for only some of the layers in the EL layer 1003.

For example, the hole-inject layer 1011 can be formed using molybdenum oxide, vanadium oxide, ruthenium oxide, tungsten oxide, manganese oxide, or the like. In addition, any of the following substances can be used: a phthalocyanine-based compound such as phthalocyanine (abbreviation: H$_2$Pc) or copper phthalocyanine (abbreviation: CuPc), a high molecule such as poly(3,4-ethylenedioxythiophene)/poly(styrenesulfonate) (PEDOT/PSS), or the like.

As the hole-inject layer 1011, a layer that includes a substance having a high hole-transport property and a substance having an electron-accepting property can be used. The layer that includes a substance having a high hole-transport property and a substance having an electron-accepting property has a high carrier density and an excellent hole-inject property. In addition, when the layer that includes a substance having a high hole-transport property and a substance having an electron-accepting property is used as the hole-inject layer in contact with the electrode functioning as an anode, various kinds of metals, alloys, electrically conductive compounds, mixtures thereof, or the like can be used regardless of the work function for a material of the electrode functioning as the anode.

The layer that includes a substance having a high hole-transport property and a substance having an electron-accepting property can be formed using, for example, a deposition donor substrate provided with material layers which is a stack of a layer that includes a substance having a high hole-transport property and a layer that includes a substance having an electron-accepting property.

Examples of the substance having an electron-accepting property which is used for the hole-inject layer 1011 include 7,7,8,8-tetracyano-2,3,5,6-tetrafluoroquinodimethane (abbreviation: F$_4$-TCNQ), chloranil, and the like. In addition, a transition metal oxide can be given. Further, an oxide of a metal belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron-accepting property. Among these, molybdenum oxide is especially preferable since it is stable in air, its hygroscopic property is low, and it can be easily handled.

As the substance having a high hole-transport property which is used for the hole-inject layer 1011, any of a variety of compounds such as aromatic amine compounds, carbazole derivatives, aromatic hydrocarbons, or high molecular compounds (e.g., oligomers, dendrimers, or polymers) can be used. Note that the substance having a high hole-transport property, which is used for the hole-inject layer, is preferably a substance having a hole mobility of $10^{-6}$ cm$^2$/Vs or more. Further, other substances may also be used as long as the hole-transport property thereof is higher than the electron-transport property thereof. Specific examples of the substance having a high hole-transport property, which can be used for the hole-inject layer 1011, are given below.

As the aromatic amine compound that can be used for the hole-inject layer 1011, for example, there are 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. In addition, there are also N,N'-bis(4-methylphenyl)(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like.

As the carbazole derivative that can be used for the hole-inject layer 1011, specifically, there are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(9-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

As the aromatic hydrocarbon that can be used for the hole-inject layer 1011, for example, there are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can also be used. As described above, aromatic hydrocarbon having a hole mobility of $1 \times 10^{-6}$ cm$^2$/Vs or more and having 14 to 42 carbon atoms is more preferably used.

Note that the aromatic hydrocarbon that can be used for the hole-inject layer 1011 may have a vinyl skeleton. As the aromatic hydrocarbon having a vinyl group, for example, there are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

The hole-inject layer 1011 can be formed by using a deposition donor substrate provided with material layers that includes a stack of a layer including the substance having a high hole-transport property and a layer including the substance having an electron-accepting property. When a metal oxide is used as the substance having an electron-accepting property, it is preferable to form a layer including a metal oxide after a layer including the substance having a high hole-transport property is formed over the substrate 1001. This is because, in many cases, a metal oxide has a higher decomposition temperature or evaporation temperature than the substance having a high hole-transport property. An evaporation source with such a structure makes it possible to efficiently sublime the substance having a high hole-transport property and a metal oxide. In addition, local non-uniformity of the concentration in a film formed by evaporation can be suppressed. There are only a few kinds of solvents which dissolve or disperse both the substance with a high hole-transport property and a metal oxide, and a mixed solution is not easily formed. Therefore, it is difficult to directly form a mixed layer by a wet process. However, the use of the deposition method of Embodiment 6 makes it possible to easily form a mixed layer which includes the substance having a high hole-transport property and a metal oxide.

In addition, the layer which includes the substance having a high hole-transport property and the substance having an electron-accepting property is excellent not only in a hole-inject property but also in a hole-transport property, and thus the above-described hole-inject layer 1011 may also be used as the hole-transport layer.

The hole-transport layer 1012 includes a substance having a high hole-transport property. As the substance having a high hole-transport property, for example, there are aromatic amine compounds such as 4,4'-bis[N-(1-naphthyl)-N-phenylamino]biphenyl (abbreviation: NPB or α-NPD), N,Nα-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB), and the like. The substances described here are mainly substances having a hole mobility of $10^{-6}$ cm$^2$/Vs or more. Note that any other substances may also be used as long as the hole-transport property thereof is higher than the electron-transport property thereof. Note that the layer that includes the substance having a high hole-transport property is not limited to a single layer, but two or more layers that include the aforementioned substances may be stacked.

The electron-transport layer 1014 includes a substance having a high electron-transport property. As the substance having a high electron-transport property, for example, there are metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Alternatively, metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$) can be used. Further alternatively, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), bathophenanthroline (abbreviation: BPhen), bathocuproine (abbreviation: BCP), or the like can also be used. The substances described here are mainly substances having an electron mobility of $10^{-6}$ cm$^2$/Vs or more. Note that any other substances may also be used as the electron-transport layer as long as the electron-transport property thereof is higher than the hole-transport property thereof. In addition, the electron-transport layer is not limited to a single layer, but two or more layers that include the aforementioned substances may be stacked.

As the electron-inject layer 1015, an alkali metal compound or an alkaline earth metal compound such as lithium fluoride (LiF), cesium fluoride (CsF), or calcium fluoride (CaF$_2$) can be used. Furthermore, a layer in which a substance having an electron-transport property is combined with an alkali metal or an alkaline earth metal can be employed. For instance, a layer of Alq to which magnesium (Mg) is added can be used. It is preferable to use the layer in which the substance having an electron-transport property is combined with an alkali metal or an alkaline earth metal as the electron-inject layer, since electron injection from the second electrode 1004 efficiently proceeds.

Note that there is no particular limitation on a stack structure of the layers included in the EL layer 1003. The EL layer 1003 may be formed by appropriate combination of a light-emitting layer with any of layers which include a substance having a high electron-transport property, a substance having a high hole-transport property, a substance having a high electron-inject property, a substance having a high hole-inject property, a bipolar substance (a substance having high electron property and a high hole-transport property), and the like.

Light emission from the EL layer 1003 is extracted to the outside through one or both of the first electrode 1002 and the second electrode 1004. Therefore, one or both of the first electrode 1002 and the second electrode 1004 are light-transmitting electrodes. In the case where only the first electrode 1002 is a light-transmitting electrode, light is extracted from the substrate 1001 side through the first electrode 1002. In the case where only the second electrode 1004 is a light-transmitting electrode, light is extracted from the side opposite to the substrate 1001 through the second electrode 1004. When both the first electrode 1002 and the second electrode 1004 are light-transmitting electrodes, light is extracted from both the substrate 1001 side and the side opposite to the substrate 1001 through the first electrode 1002 and the second electrode 1004.

Although FIGS. 8A and 8B illustrate a structure in which the first electrode 1002 that functions as an anode is disposed on the substrate 1001 side, the second electrode 1004 that functions as a cathode may also be disposed on the substrate 1001 side.

The EL layer 1003 is formed by appropriate combination of the methods described in any of the above Embodiments, which may be combined with other deposition methods. Further, different formation methods may be used to form the electrodes and the layers. Examples of a dry process include a vacuum evaporation method, an electron beam evaporation method, a sputtering method, and the like. Examples of a wet process include an inkjet method, a spin-coating method, and the like.

In the light-emitting element according to Embodiment 6, the EL layer to which the deposition donor substrate of any of the above Embodiments is applied can be formed. Accordingly, a film can be formed with high accuracy and efficiency. Therefore, not only improvement in characteristics of the light-emitting element, but also improvement in yield and a reduction in costs can be achieved.

(Embodiment 7)

In Embodiment 7, a light-emitting device which is formed using a light-emitting element described in Embodiment 6 will be described.

First, a passive-matrix light-emitting device is described with reference to FIGS. 9A to 9C and FIG. 10.

In a passive-matrix (also called simple-matrix) light-emitting device, a plurality of anodes arranged in stripes (in stripe form) are provided to be orthogonal to a plurality of cathodes arranged in stripes. A light-emitting layer is interposed at each intersection. Therefore, a pixel at an intersection of an anode selected (to which a voltage is applied) and a cathode selected emits light.

Figure 9A:
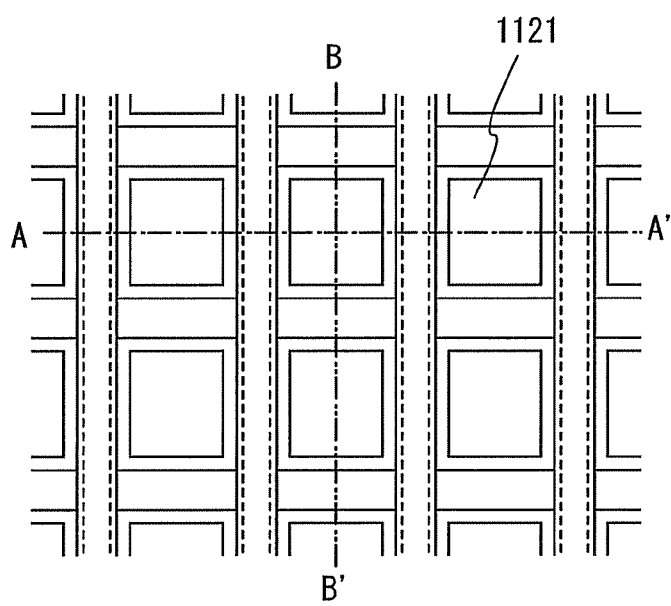
FIGS. 9A to 9C illustrate a passive matrix light-emitting device.
Figure 9C:
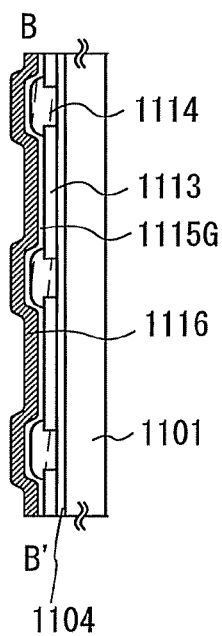
Figure 9B:
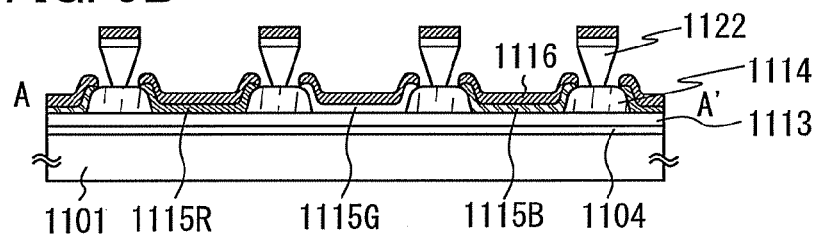

FIG. 9A is a top view of a pixel portion before sealing. FIG. 9B is a cross-sectional view taken along dashed line A-A' in FIG. 9A. FIG. 9C is a cross-sectional view taken along dashed line B-B'.

Over a substrate 1101, an insulating layer 1104 is formed as a base insulating layer. Note that the insulating layer 1104 is not necessarily formed if the base insulating layer is not needed. A plurality of first electrodes 1113 are arranged in stripes at regular intervals over the insulating layer 1104. A partition 1114 having openings each corresponding to a pixel is provided over the first electrodes 1113. The partition 1114 having openings is formed using an insulating material (a photosensitive or nonphotosensitive organic material such as polyimide, acrylic, polyamide, polyimide amide, resist, or benzocyclobutene, or an SOG film such as a SiO$_x$ film including an alkyl group). Note that each opening corresponding to a pixel is a light-emitting region 1121.

Over the partition 1114 having openings, a plurality of inversely tapered partitions 1122 are provided in parallel so as to intersect the first electrodes 1113. The inversely tapered partitions 1122 can be formed in such a manner that, in accordance with a photolithography method, a positive-type photosensitive resin of which a portion unexposed to light remains is used and the amount of light exposure or the length of development time is adjusted so that a lower portion of a pattern is etched more.

The total thickness of the partition 1114 having openings and the inversely tapered partitions 1122 is set to be larger than the total thickness of EL layers and second electrodes 1116. Thus, EL layers separated into a plurality of regions, specifically, an EL layer (R) (1115R) including a material which exhibits red light emission, an EL layer (G) (1115G) including a material which exhibits green light emission, and an EL layer (B) (1115B) including a material which exhibits blue light emission and the second electrodes 1116 are formed. Note that the plurality of separated regions are electrically isolated from each other.

The second electrodes 1116 are electrodes which are arranged in stripes and parallel to each other, and extend in a direction intersecting with the first electrodes 1113. Note that the EL layers and conductive layers forming the second electrodes 1116 are also formed partly over the inversely tapered partitions 1122; however, they are isolated from the EL layer (R) (1115R), the EL layer (G) (1115G), the EL layer (B) (1115B), and the second electrodes 1116. Note that the EL layer in Embodiment 7 is a layer including at least a light-emitting layer and may include a hole-inject layer, a hole-transport layer, an electron-transport layer, an electron-inject layer, or the like as appropriate, in addition to the light-emitting layer.

Here, an example is described in which the EL layer (R) (1115R), the EL layer (G) (1115G), and the EL layer (B) (1115B) are formed as selected to form a light-emitting device that provides three kinds of light emission (red (R), green (G), and blue (B)) and is capable of performing full color display. The EL layer (R) (1115R), the EL layer (G) (1115G), and the EL layer (B) (1115B) are formed into stripes parallel to each other. These EL layers may be formed by any of the deposition methods described in Embodiments 1 and 2.

Further, sealing is performed using a sealing member such as a sealing can or a glass substrate for sealing, if necessary. Here, a glass substrate is used as a sealing substrate, and the substrate and the sealing substrate are attached to each other with an adhesive material such as a sealant to tightly seal a space surrounded by the adhesive material such as a sealant. The space sealed is filled with filler or a dried inert gas. In addition, a desiccant or the like may be put between the substrate and the sealing member so that reliability of the light-emitting device can be improved. The desiccant removes a minute amount of moisture for sufficient desiccation. For the desiccant, a substance that adsorbs moisture by chemical adsorption such as an oxide of an alkaline earth metal, e.g., calcium oxide or barium oxide, can be used. In addition, a substance that adsorbs moisture by physical adsorption such as zeolite or silicagel may also be used.

The desiccant is not necessarily provided if a sealing member that covers and is in contact with the light-emitting element sufficiently blocks the outside air.

Figure 10:
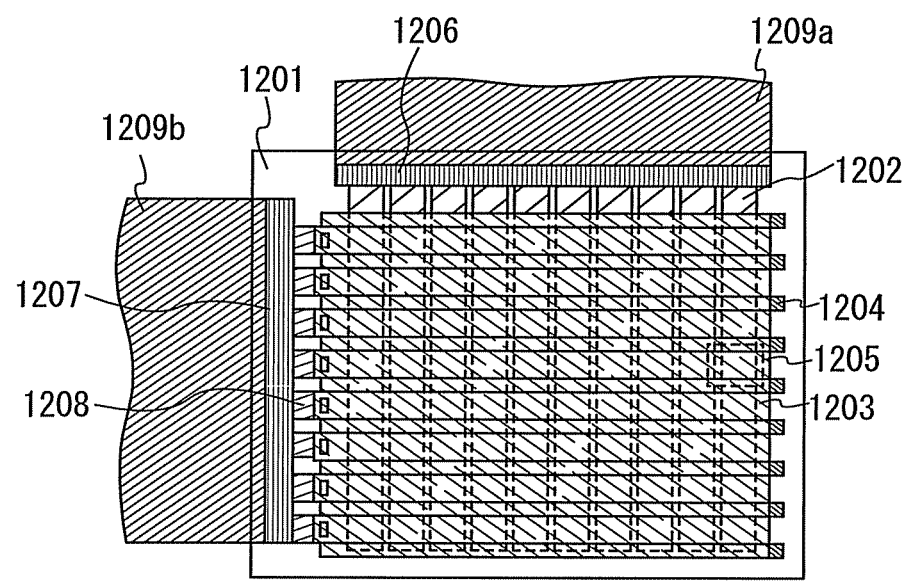
FIG. 10 illustrates a passive matrix light-emitting device.

Then, FIG. 10 is a top view of the case where the passive-matrix light-emitting device illustrated in FIGS. 9A to 9C is mounted with an FPC or the like.

In FIG. 10, in a pixel portion forming an image display, scan lines and data lines are arranged to intersect with each other so as to be orthogonal to each other.

Here, the first electrodes 1113 in FIGS. 9A to 9C correspond to scan lines 1203 in FIG. 10; the second electrodes 1116 correspond to data lines 1202; and the inversely tapered partitions 1122 correspond to partitions 1204. EL layers are sandwiched between the data lines 1202 and the scan lines 1203, and an intersection indicated by a region 1205 corresponds to one pixel.

Note that the scan lines 1203 are electrically connected at their ends to connection wirings 1208, and the connection wirings 1208 are connected to an FPC 1209*b* through an input terminal 1207. The data lines are connected to an FPC 1209*a* through an input terminal 1206.

In addition, an optical film such as a polarizing plate, a circularly polarizing plate (including an elliptically polarizing plate), a retardation plate (a λ/4 plate or a λ/2 plate), or a color filter may be provided as appropriate on the light-emission surface. Further, the polarizing plate or the circularly polarizing plate may be provided with an anti-reflection film. For example, anti-glare treatment which can diffuse reflected light by the depression/projection of the surface and reduce reflection is possible.

Although FIG. 10 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. As an alternative mounting technique to a COG method, TCP or wire bonding may be used. TCP is TAB tape on which an IC is mounted, and the IC is mounted by connecting the TAB tape to wirings over the element-forming substrate. Each of the data line side IC and the scan line side IC may be formed using a silicon substrate. Alternatively, it may be formed in such a manner that a driver circuit is formed using a TFT over a glass substrate, a quartz substrate, or a plastic substrate. Although the example is described in which one IC is provided on one side, a plurality of ICs may be provided on one side.

Figure 11A:
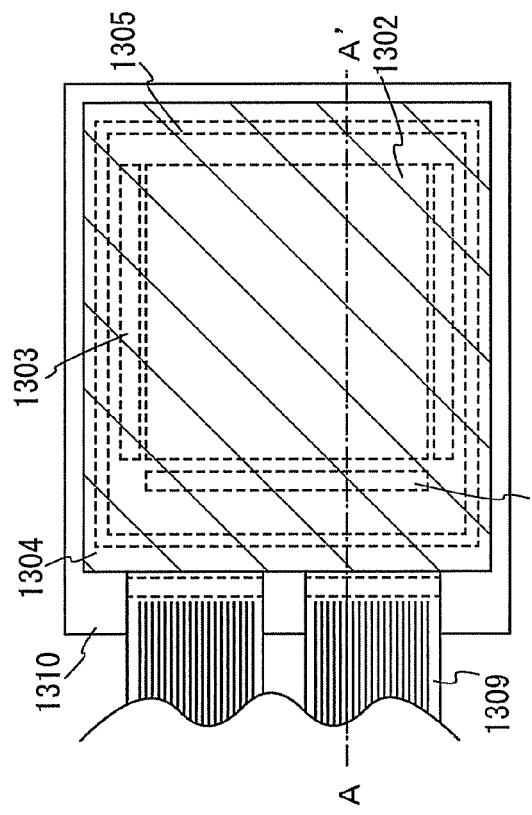
FIGS. 11A and 11B illustrate an active matrix light-emitting device.
Figure 11B:
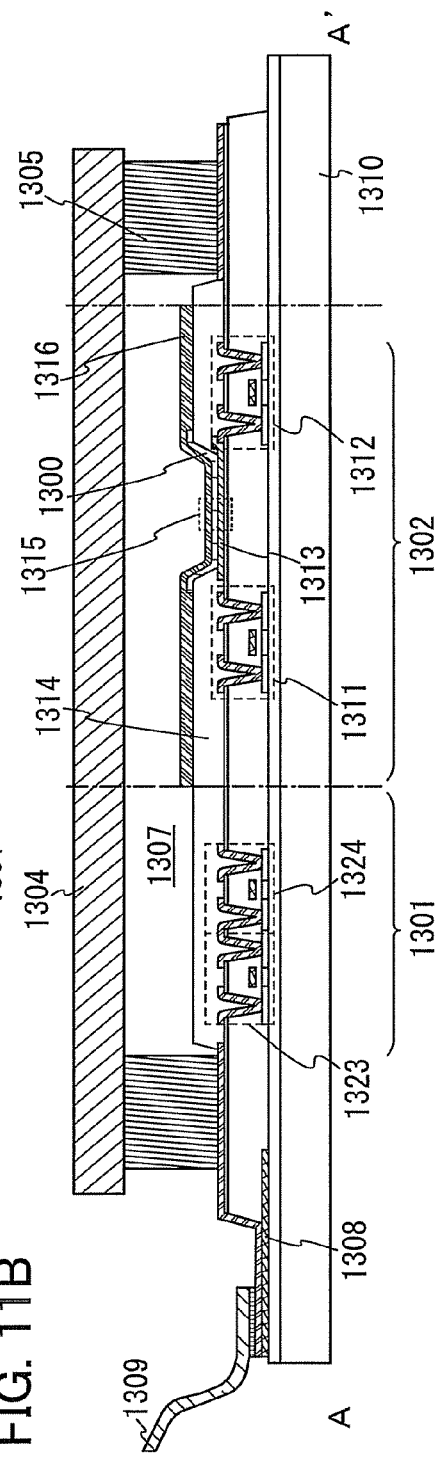

Next, an example of an active matrix light-emitting device is described using FIGS. 11A and 11B. FIG. 11A is a top view illustrating a light-emitting device and FIG. 11B is a cross-sectional view taken along dashed line A-A' in FIG. 11A. The active matrix light-emitting device of Embodiment 7 includes a pixel portion 1302, a driver circuit portion (a source side driver circuit) 1301, and a driver circuit portion (a gate side driver circuit) 1303 provided over an element substrate 1310. The pixel portion 1302, the driver circuit portion 1301, and the driver circuit portion 1303 are sealed with a sealant 1305 between the element substrate 1310 and a sealing substrate 1304.

In addition, over the element substrate 1310, a lead wiring 1308 for connecting an external input terminal, through which a signal (e.g., a video signal, a clock signal, a start signal, a reset signal, or the like) or electric potential from the outside is transmitted to the driver circuit portion 1301 and the driver circuit portion 1303, is provided. Here, an example is described in which a flexible printed circuit (FPC) 1309 is provided as the external input terminal. Although only the FPC is illustrated here, this FPC may be provided with a printed wiring board (PWB). The light-emitting device in this specification includes not only a light-emitting device body but also a state in which an FPC or a PWB is attached thereto.

Then, a cross-sectional structure is described using FIG. 11B. Although the driver circuit portions and the pixel portion are formed over the element substrate 1310, the pixel portion 1302 and the driver circuit portion 1301 which is the source side driver circuit are illustrated here.

An example of the driver circuit portion 1301 in which a CMOS circuit is formed by combining an n-channel TFT 1323 and a p-channel TFT 1324 is illustrated. Note that a circuit included in the driver circuit portion may be formed using any of various CMOS circuits, PMOS circuits, or NMOS circuits. Although a driver-integrated type where the driver circuit is formed over the substrate is described in Embodiment 7, the present invention is not limited to this structure, and the driver circuit may be formed outside the substrate, not over the substrate.

Moreover, the pixel portion 1302 is formed using plural pixels each including a switching TFT 1311, a current control TFT 1312, and a first electrode 1313 which is electrically connected to a wiring (a source electrode or a drain electrode) of the current control TFT 1312. Note that an insulator 1314 is formed to cover edge portions of the first electrode 1313. Here, the insulator 1314 is formed using a positive photosensitive acrylic resin.

The insulator 1314 is preferably formed so as to have a curved surface with a curvature at an upper edge portion or a lower edge portion in order to obtain favorable coverage by a film which is to be stacked over the insulator 1314. For example, in the case of using a positive photosensitive acrylic resin as a material for the insulator 1314, the insulator 1314 is preferably formed so as to have a curved surface with a curvature radius (0.2 to 3 µm) at the upper edge portion. Either a negative photosensitive material which becomes insoluble in an etchant by light or a positive photosensitive material which becomes soluble in an etchant by light can be used for the insulator 1314. As the insulator 1314, without limitation to an organic compound, an inorganic compound such as silicon oxide or silicon oxynitride can also be used.

An EL layer 1300 and a second electrode 1316 are stacked over the first electrode 1313. Note that when an ITO film is used as the first electrode 1313 and a stack of a titanium nitride film and a film including aluminum as the main component or a stack of a titanium nitride film, a film including aluminum as the main component, and a titanium nitride film is used as the wiring of the current control TFT 1312 which is connected to the first electrode 1313, resistance of the wiring is low and favorable ohmic contact with the ITO film can be obtained. Note that although not illustrated here, the second electrode 1316 is electrically connected to the FPC 1309 which is an external input terminal.

In the EL layer 1300, at least a light-emitting layer is provided, and in addition to the light-emitting layer, one or more of a hole-inject layer, a hole-transport layer, an electron-transport layer, and an electron-inject layer are provided as appropriate. The first electrode 1313, the EL layer 1300, and the second electrode 1316 are stacked, whereby a light-emitting element 1315 is formed.

Although the cross-sectional view in FIG. 11B illustrates only one light-emitting element 1315, a plurality of light-emitting elements are arranged in matrix in the pixel portion 1302. Light-emitting elements which provide three kinds of light emission (R, G and B) are formed as selected in the pixel portion 1302, so that a light-emitting device capable of full-color display can be formed. Alternatively, by combination with color filters, a light-emitting device capable of full-color display may be formed.

By attaching the sealing substrate 1304 to the element substrate 1310 with the sealant 1305, the light-emitting element 1315 is provided in a space 1307 surrounded by the element substrate 1310, the sealing substrate 1304, and the sealant 1305. Note that the space 1307 is filled with an inert gas (such as nitrogen or argon) or the sealant 1305.

An epoxy-based resin is preferably used for the sealant 1305. In addition, it is preferable to use a material that allows permeation of moisture or oxygen as little as possible. As the sealing substrate 1304, a plastic substrate formed using fiber-glass-reinforced plastics (FRP), polyvinyl fluoride (P-VF), polyester, acrylic, or the like can be used in addition to a glass substrate or a quartz substrate.

In this manner, the light-emitting device can be obtained according to any of the above Embodiments. An active matrix light-emitting device tends to require high manufacturing costs per device because TFTs are manufactured; however, application of any of the above Embodiments makes it possible to drastically reduce loss of materials in forming light-emitting elements. Thus, a reduction in manufacturing costs can be achieved.

Further, by application of the deposition method described in any of the above Embodiments, an EL layer included in a light-emitting element can be easily formed and a light-emitting device having the light-emitting element can be easily manufactured. In addition, a flat and even film can be formed and a fine pattern can also be formed; thus, a high-definition light-emitting device can be obtained. Further, a lamp heater or the like with large energy power can be used as a light source for deposition; accordingly, cycle time can be shortened, which can lead to a reduction in manufacturing costs.

Note that the structure described in Embodiment 7 can be combined with any of the structures described in other embodiments as appropriate.

(Embodiment 8)

In Embodiment 8, with reference to FIGS. 12A to 12E, various electronic devices manufactured using a light-emitting device according to any of the above Embodiments will be described.

Examples of the electronic devices according to Embodiment 8 to which the light-emitting device is applied include televisions, cameras such as video cameras and digital cameras, goggle type displays (head-mounted displays), navigation systems, audio playback devices (e.g., car audio systems and audio systems), laptop computers, game machines, portable information terminals (e.g., mobile computers, cellular phones, portable game machines, and electronic book readers), image playback devices in which a recording medium is provided (devices that are capable of playing back recording media such as digital versatile discs (DVDs) and equipped with a display device that can display an image thereof), lighting apparatus, and the like. Specific examples of these electronic devices are illustrated in FIGS. 12A to 12E.

Figure 12A:
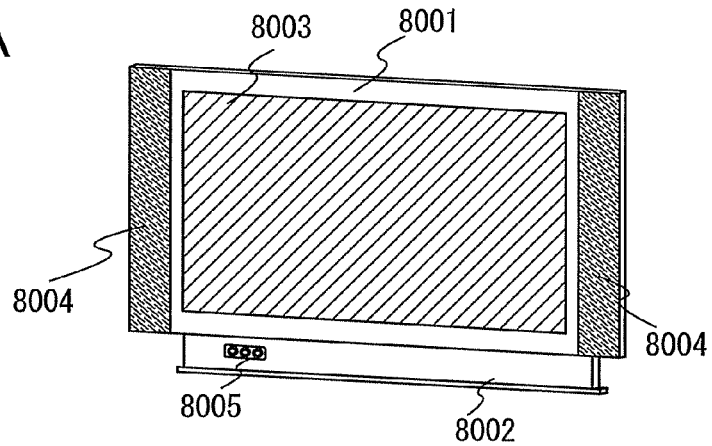
FIGS. 12A to 12E each illustrate an electronic device.

FIG. 12A illustrates a display device, which includes a housing 8001, a supporting base 8002, a display portion 8003, a speaker portion 8004, video input terminals 8005, and the like. The display device is manufactured by applying the light-emitting device formed in accordance with any of the above Embodiments to the display portion 8003. Note that the category of the display device includes all types of information display devices, for example, display devices for a personal computer, display devices for TV broadcast reception, display devices for advertisement display, and the like. Application of Embodiment 8 makes it possible to achieve an increase in the use efficiency of a material and an increase in the manufacturing efficiency mainly in a deposition process of a light-emitting device. Accordingly, manufacturing costs can be reduced and productivity can be improved in manufacturing the display device; thus, an inexpensive display device can be provided.

Figure 12B:
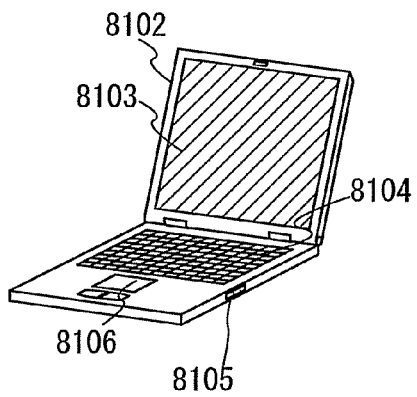

FIG. 12B illustrates a computer, which includes a housing 8102, a display portion 8103, a keyboard 8104, an external connecting port 8105, a pointing device 8106, and the like. Note that the computer is manufactured by applying the light-emitting device is formed in accordance with any of the above Embodiments to the display portion 8103. Application of Embodiment 8 makes it possible to achieve an increase in the use efficiency of a material and an increase in the manufacturing efficiency mainly in a deposition process of a light-emitting device. Accordingly, manufacturing costs can be reduced and productivity can be improved in manufacturing the computer; thus, an inexpensive computer can be provided.

Figure 12C:
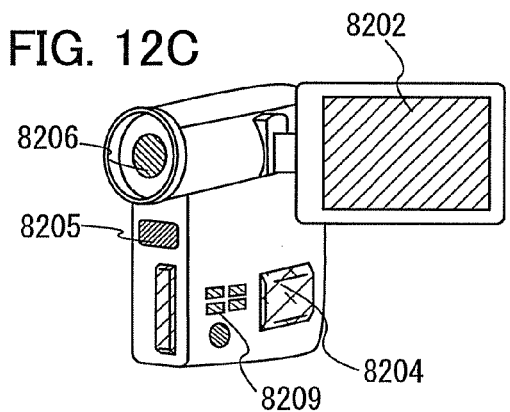

FIG. 12C illustrates a video camera, which includes a display portion 8202, an external connecting port 8204, a remote control receiving portion 8205, an image receiving portion 8206, an operation key 8209, and the like. Note that the video camera is manufactured by applying the light-emitting device is formed in accordance with any of the above Embodiments to the display portion 8202. Application of Embodiment 8 makes it possible to achieve an increase in the use efficiency of a material and an increase in the manufacturing efficiency mainly in a deposition process of a light-emitting device. Accordingly, manufacturing costs can be reduced and productivity can be improved in manufacturing the video camera; thus, an inexpensive video camera can be provided.

Figure 12D:
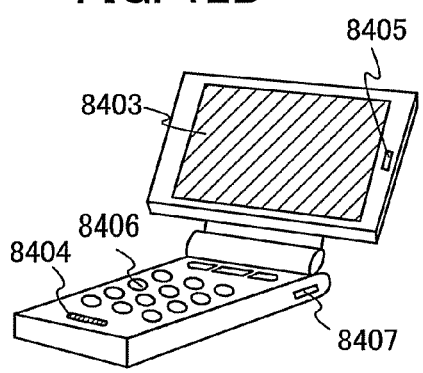

FIG. 12D illustrates a cellular phone, which includes a display portion 8403, an audio input portion 8404, an audio output portion 8405, an operation key 8406, an external connecting port 8407, and the like. Note that the cellular phone is manufactured by applying the light-emitting device is formed in accordance with any of the above Embodiments to the display portion 8403. The cellular phone may further have an infrared communication function, a television receiving function, or the like. Application of Embodiment 8 makes it possible to achieve an increase in the use efficiency of a material and an increase in the manufacturing efficiency mainly in a deposition process of a light-emitting device. Accordingly, manufacturing costs can be reduced and productivity can be improved in manufacturing the cellular phone; thus, an inexpensive cellular phone can be provided.

Figure 12E:
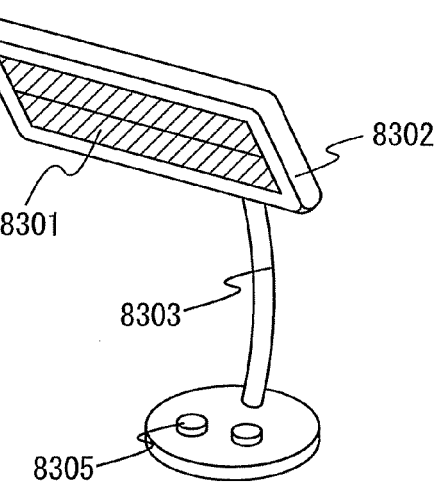

FIG. 12E illustrates a table light, which includes a lighting portion 8301, a shade 8302, an adjustable arm 8303, and a power switch 8305, and the like. Note that the desk lamp is manufactured by applying the light-emitting device is formed in accordance with any of the above Embodiments to the lighting portion 8301. Note that the term light here includes ceiling lights, wall lights, and the like. Application of Embodiment 8 makes it possible to achieve increase in efficiency in the use of materials and an increase in the manufacturing efficiency mainly in a deposition process of a light-emitting device. Accordingly, production cost can be reduced and productivity can be improved in manufacturing the desk lamp; thus, an inexpensive desk lamp can be provided.

In the above-described manner, electronic devices or lighting apparatuses can be obtained by application of the light-emitting device according to any of the above Embodiments. The application range of the light-emitting device according to any of the above Embodiments is extremely wide so that it can be applied to electronic devices of a variety of fields.

Note that the structure described in Embodiment 8 can be combined with any of the structures described in other embodiments as appropriate.

This application is based on Japanese Patent Application serial no. 2008-188004 filed with Japan Patent Office on Jul. 21, 2008, the entire contents of which are hereby incorporated by reference.

What is claimed is:

1. A deposition donor substrate comprising:
light-absorbing layers on a substrate;
partition layers on the substrate and each between the light-absorbing layers; and
material layers on the light-absorbing layers and on the partition layers so that the material layers are separated from each other,
wherein each of the light-absorbing layers are island shaped or stripe shaped.

2. The deposition donor substrate according to claim 1, wherein each light-absorbing layer comprises any of titanium nitride, tantalum nitride, molybdenum nitride, tungsten nitride, chromium nitride, titanium, molybdenum, tungsten, or carbon.

3. The deposition donor substrate according to claim 1, wherein each material layer comprises an organic compound.

4. The deposition donor substrate according to claim 1, wherein each material layer comprises one or both of a light-emitting material and a carrier-transport material.

5. The deposition donor substrate according to claim 1, wherein, in each partition layer, an angle between a side in contact with the substrate and a sidewall is greater than or equal to 100° and less than or equal to 130°.

6. The deposition donor substrate according to claim 1, wherein a thickness of each light-absorbing layer is greater than or equal to 100 nm and less than or equal to 500 nm and a thickness of each partition layer is greater than or equal to 1 μm and less than or equal to 2 μm.

7. The deposition donor substrate according to claim 1, wherein thermal conductivity of each partition layer is lower than thermal conductivity of each light-absorbing layer.

8. A deposition donor substrate comprising:
light-absorbing layers separated from each other on a substrate;
partition layers on the substrate and each between the light-absorbing layers; and
material layers on the light-absorbing layers and on the partition layers so that the material layers are separated from each other,
wherein each of the light-absorbing layers are island shaped or stripe shaped, and
wherein each of the partition layers has an inverse taper shape.

9. The deposition donor substrate according to claim 8, wherein each light-absorbing layer comprises any of titanium nitride, tantalum nitride, molybdenum nitride, tungsten nitride, chromium nitride, titanium, molybdenum, tungsten, or carbon.

10. The deposition donor substrate according to claim 8, wherein each material layer comprises an organic compound.

11. The deposition donor substrate according to claim 8, wherein each material layer comprises one or both of a light-emitting material and a carrier-transport material.

12. The deposition donor substrate according to claim 8, wherein, in each partition layer, an angle between a side in contact with the substrate and a sidewall is greater than or equal to 100° and less than or equal to 130°.

13. The deposition donor substrate according to claim 8, wherein a thickness of each light-absorbing layer is greater than or equal to 100 nm and less than or equal to 500 nm and a thickness of each partition layer is greater than or equal to 1 μm and less than or equal to 2 μm.

14. The deposition donor substrate according to claim 8, wherein thermal conductivity of each partition layer is lower than thermal conductivity of each light-absorbing layer.

15. A deposition donor substrate comprising:
light-absorbing layers separated from each other over a substrate;
partition layers on the substrate and each between the light-absorbing layers;
reflective layers on the light-absorbing layers and on the partition layers so that the reflective layers are separated from each other; and
material layers separated from each other over the reflective layers,
wherein each of the light-absorbing layers are island shaped or stripe shaped.

16. The deposition donor substrate according to claim 15, wherein each reflective layer comprises any of silver, gold, platinum, copper, an alloy containing aluminum, an alloy containing silver, or indium oxide-tin oxide.

17. The deposition donor substrate according to claim 15, wherein each light-absorbing layer comprises any of titanium nitride, tantalum nitride, molybdenum nitride, tungsten nitride, chromium nitride, titanium, molybdenum, tungsten, or carbon.

18. The deposition donor substrate according to claim 15, wherein each material layer comprises an organic compound.

19. The deposition donor substrate according to claim 15, wherein each material layer comprises one or both of a light-emitting material and a carrier-transport material.

20. The deposition donor substrate according to claim 15, wherein, in each partition layer, an angle between a side in contact with the substrate and a sidewall is greater than or equal to 100° and less than or equal to 130°.

21. The deposition donor substrate according to claim 15, wherein a thickness of each light-absorbing layer is greater than or equal to 100 nm and less than or equal to 500 nm and a thickness of each partition layer is greater than or equal to 1 μm and less than or equal to 2 μm.

22. The deposition donor substrate according to claim 15, wherein thermal conductivity of each partition layer is lower than thermal conductivity of each light-absorbing layer.

23. A deposition donor substrate comprising:
a first partition layer and a second partition layer on a substrate;
a light-absorbing layer on the substrate and between the first partition layer and the second partition layer; and
a material layer on the light-absorbing layer,
wherein each of the first partition layer and the second partition layer are island shaped or stripe shaped.

24. The deposition donor substrate according to claim 23, wherein the light-absorbing layer comprises any of titanium nitride, tantalum nitride, molybdenum nitride, tungsten nitride, chromium nitride, titanium, molybdenum, tungsten, or carbon.

25. The deposition donor substrate according to claim 23, wherein the material layer comprises an organic compound.

26. The deposition donor substrate according to claim 23, wherein the material layer comprises one or both of a light-emitting material and a carrier-transport material.

27. The deposition donor substrate according to claim 23, wherein, in each of the first partition layer and the second partition layer, an angle between a side in contact with the substrate and a sidewall is greater than or equal to 100° and less than or equal to 130°.

28. The deposition donor substrate according to claim 23, wherein a thickness of the light-absorbing layer is greater than or equal to 100 nm and less than or equal to 500 nm and a thickness of each of the first partition layer and the second partition layer is greater than or equal to 1 μm and less than or equal to 2 μm.

29. The deposition donor substrate according to claim 23, wherein thermal conductivity of each of the first partition layer and the second partition layer is lower than thermal conductivity of the light-absorbing layer.

30. The deposition donor substrate according to claim 1, wherein each of the partition layers has a thickness larger than a sum of thickness of each of the light-absorbing layers and thickness of each of the material layers.

31. The deposition donor substrate according to claim 8, wherein each of the partition layers has a thickness larger than a sum of thickness of each of the light-absorbing layers and thickness of each of the material layers.

32. The deposition donor substrate according to claim 15, wherein each of the partition layers has a thickness larger than a sum of thickness of each of the light-absorbing layers and thickness of each of the material layers.

33. The deposition donor substrate according to claim 23, wherein each of the first partition layer and the second partition layer has a thickness larger than a sum of thickness of the light-absorbing layer and thickness of the material layer.

* * * * *